United States Patent
Sithanandam

(10) Patent No.: US 12,266,927 B2
(45) Date of Patent: Apr. 1, 2025

(54) ELECTROSTATIC DISCHARGE (ESD) PROTECTION CIRCUITS USING TUNNELING FIELD EFFECT TRANSISTOR (TFET) AND IMPACT IONIZATION MOSFET (IMOS) DEVICES

(71) Applicant: STMicroelectronics International N.V., Geneva (CH)

(72) Inventor: Radhakrishnan Sithanandam, Greater Noida (IN)

(73) Assignee: STMicroelectronics International N.V., Geneva (CH)

(*) Notice: Subject to any disclaimer, the term of this patent is extended or adjusted under 35 U.S.C. 154(b) by 117 days.

(21) Appl. No.: 18/207,493

(22) Filed: Jun. 8, 2023

(65) Prior Publication Data

US 2023/0318287 A1    Oct. 5, 2023

Related U.S. Application Data

(63) Continuation of application No. 17/222,352, filed on Apr. 5, 2021, now Pat. No. 11,710,961, which is a
(Continued)

(51) Int. Cl.
*H02H 9/04*     (2006.01)
*H01L 23/528*   (2006.01)
(Continued)

(52) U.S. Cl.
CPC ........... *H02H 9/046* (2013.01); *H01L 23/528* (2013.01); *H01L 27/0255* (2013.01);
(Continued)

(58) Field of Classification Search
CPC ... H02H 9/046; H01L 23/528; H01L 27/0255; H01L 27/0262; H01L 27/0266; H01L 27/0635; H01L 27/1203
See application file for complete search history.

(56) References Cited

U.S. PATENT DOCUMENTS

| 5,400,202 A | 3/1995 | Metz et al. |
| 5,452,171 A | 9/1995 | Metz et al. |

(Continued)

FOREIGN PATENT DOCUMENTS

| CN | 1476090 A | 2/2004 |
| CN | 104835816 A | 8/2015 |

(Continued)

OTHER PUBLICATIONS

Bourgeat, et al.: "Single and Compact ESD Device Beta-Matrix Solution Based on Bidirectional SCR Network in Advanced 28/32 NM Technology Node," Solid State Electronics, vol. 87, Sep. 2013 (pp. 34-42).

(Continued)

*Primary Examiner* — Scott Bauer
(74) *Attorney, Agent, or Firm* — Crowe & Dunlevy LLC

(57) ABSTRACT

Electrostatic discharge (ESD) protection is provided in circuits which use of a tunneling field effect transistor (TFET) or an impact ionization MOSFET (IMOS). These circuits are supported in silicon on insulator (SOI) and bulk substrate configurations to function as protection diodes, supply clamps, failsafe circuits and cutter cells. Implementations with parasitic bipolar devices provide additional parallel discharge paths.

18 Claims, 17 Drawing Sheets

Related U.S. Application Data continuation of application No. 15/908,878, filed on Mar. 1, 2018, now Pat. No. 10,998,721.

(60) Provisional application No. 62/506,709, filed on May 16, 2017, provisional application No. 62/478,302, filed on Mar. 29, 2017.

(51) Int. Cl.

| | | |
|---|---|---|
| *H01L 27/02* | (2006.01) | |
| *H01L 27/06* | (2006.01) | |
| *H01L 27/12* | (2006.01) | |
| *H01L 29/06* | (2006.01) | |
| *H01L 29/08* | (2006.01) | |
| *H01L 29/739* | (2006.01) | |
| *H01L 29/78* | (2006.01) | |
| *H01L 29/87* | (2006.01) | |
| *H01L 29/73* | (2006.01) | |
| *H01L 49/02* | (2006.01) | |

(52) U.S. Cl.
CPC ...... *H01L 27/0262* (2013.01); *H01L 27/0266* (2013.01); *H01L 27/0635* (2013.01); *H01L 27/1203* (2013.01); *H01L 29/0649* (2013.01); *H01L 29/0847* (2013.01); *H01L 29/7391* (2013.01); *H01L 29/7835* (2013.01); *H01L 29/87* (2013.01); *H01L 28/20* (2013.01); *H01L 28/40* (2013.01); *H01L 29/0653* (2013.01); *H01L 29/73* (2013.01)

(56) References Cited

U.S. PATENT DOCUMENTS

| | | | |
|---|---|---|---|
| 5,500,546 | A | 3/1996 | Marum et al. |
| 5,528,188 | A | 6/1996 | Au et al. |
| 5,869,873 | A * | 2/1999 | Yu .................... H02H 9/046 |
| | | | 257/362 |
| 6,208,494 | B1 | 3/2001 | Nakura et al. |
| 6,919,602 | B2 | 7/2005 | Lin et al. |
| 7,245,468 | B2 | 7/2007 | Griesbach et al. |
| 7,408,754 | B1 | 8/2008 | O et al. |
| 7,589,945 | B2 | 9/2009 | Miller et al. |
| 8,129,788 | B1 | 3/2012 | Walker et al. |
| 8,759,871 | B2 | 6/2014 | Song et al. |
| 8,891,212 | B2 | 11/2014 | Abou-Khalil et al. |
| 9,401,351 | B2 | 7/2016 | Jimenez et al. |
| 9,484,739 | B2 * | 11/2016 | Coyne ...................... H02H 7/16 |
| 2002/0064007 | A1 | 5/2002 | Chang et al. |
| 2005/0151160 | A1 | 7/2005 | Salcedo et al. |
| 2006/0244071 | A1 * | 11/2006 | Kondo ................ H01L 27/0262 |
| | | | 257/355 |
| 2007/0247772 | A1 | 10/2007 | Keppens et al. |
| 2008/0049365 | A1 | 2/2008 | Worley et al. |
| 2008/0088994 | A1 * | 4/2008 | Lai ...................... H01L 27/0262 |
| | | | 361/56 |
| 2008/0225450 | A1 | 9/2008 | Hayashi |
| 2010/0090283 | A1 | 4/2010 | Langguth et al. |
| 2010/0165523 | A1 | 7/2010 | Son |
| 2012/0120531 | A1 | 5/2012 | Abou-Khalil et al. |
| 2013/0200493 | A1 * | 8/2013 | Sorgellos ............ H01L 27/0262 |
| | | | 257/577 |
| 2014/0036399 | A1 | 2/2014 | Ory et al. |
| 2014/0185167 | A1 | 7/2014 | Peng et al. |
| 2015/0194420 | A1 | 7/2015 | Wang et al. |
| 2015/0318275 | A1 | 11/2015 | Chen et al. |
| 2016/0141287 | A1 | 5/2016 | He et al. |
| 2017/0077082 | A1 | 3/2017 | Marreiro et al. |
| 2017/0155243 | A1 | 6/2017 | Tan et al. |
| 2017/0271322 | A1 | 9/2017 | Russ et al. |
| 2017/0278839 | A1 | 9/2017 | Lai |
| 2018/0012961 | A1 * | 1/2018 | Aharoni ............. H01L 27/0266 |
| 2018/0115154 | A1 | 4/2018 | Wakita |
| 2018/0287378 | A1 | 10/2018 | Sithanandam |
| 2019/0165571 | A1 | 5/2019 | Batra et al. |
| 2019/0173278 | A1 | 6/2019 | Jang et al. |
| 2019/0190256 | A1 | 6/2019 | Agarwal et al. |
| 2019/0267801 | A1 | 8/2019 | Kumar et al. |
| 2019/0319453 | A1 | 10/2019 | Sithanandam et al. |

FOREIGN PATENT DOCUMENTS

| | | |
|---|---|---|
| DE | 102017223391 A1 | 1/2019 |
| JP | 2011176091 A | 9/2011 |
| JP | 2016162884 A | 9/2016 |

OTHER PUBLICATIONS

Sithanandam, Radhakrishnan et al: "A Novel Cascade-Free 5-V ESD Clamp Using I-MOS: Proposal and Analysis," IEEE Transactions on Device and Materials Reliability, vol. 16, No. 2, Jun. 2016 (pp. 200-207).

* cited by examiner

ELECTROSTATIC DISCHARGE (ESD) PROTECTION CIRCUITS USING TUNNELING FIELD EFFECT TRANSISTOR (TFET) AND IMPACT IONIZATION MOSFET (IMOS) DEVICES

CROSS REFERENCE TO RELATED APPLICATIONS

This application is a continuation of U.S. patent application Ser. No. 17/222,352 filed Apr. 5, 2021, which is a continuation of U.S. patent application Ser. No. 15/908,878 filed Mar. 1, 2018, which claims the priority benefit of U.S. Provisional Application Patent No. 62/506,709 filed May 16, 2017, and U.S. Provisional Application Patent No. 62/478,302 filed Mar. 29, 2017, the disclosures of which are incorporated herein by reference.

TECHNICAL FIELD

The present invention relates to a device for protecting an integrated circuit against overvoltages and, in particular, against electrostatic discharges.

BACKGROUND

FIG. 1 shows a circuit diagram for a conventional electrostatic discharge (ESD) protection device 10. The device 10 is formed by a first protection diode 12 coupled between an input/output pad 14 and a first supply line 16 of an integrated circuit, and a second protection diode 18 coupled between the input/output pad 14 and a second supply line 20 of the integrated circuit. The first protection diode 12 has an anode terminal coupled to the input/output pad 14 and a cathode terminal coupled to the first supply line 16. The second protection diode 18 has a cathode terminal coupled to the input/output pad 14 and an anode terminal coupled to the second supply line 20. In this implementation, the first supply line 16 may be coupled to a positive power supply pad 22 for the integrated circuit and the second supply line 20 may be coupled to a negative or ground power supply pad 24 for the integrated circuit. The input/output pad 14 is coupled to functional circuitry 26 of the integrated circuit that is power supplied from the first and second supply lines.

FIG. 2 shows a circuit diagram for a conventional power supply clamp device 30. This device 30 is formed by a diode 32 coupled between the first and second supply lines 16 and 20, respectively, and a switching circuit 34 also coupled between the first and second supply lines 16 and 20, respectively. The diode 32 has a cathode terminal coupled to the first supply line 16 and an anode terminal coupled to the second supply line 20. The switching circuit 34 has a first conduction terminal 36 coupled to the first supply line 16 and a second conduction terminal 38 coupled to the second supply line 20. A control terminal 40 of the switching circuit 34 receives a trigger signal generated by a trigger circuit 44 that senses a transient voltage difference in the first or second supply lines 16 and 20, respectively, and asserts the trigger signal in response to the sensed difference. In an embodiment, the switching circuit 34 may, for example, comprise a MOSFET device or a triac.

FIG. 3 shows a circuit diagram for a conventional electrostatic discharge (ESD) protection and clamp device 50. The device 50 is formed by the first protection diode 12 coupled between the input/output pad 14 and the first supply line 16 of the integrated circuit, and the second protection diode 18 coupled between the input/output pad 14 and the second supply line 20 of the integrated circuit. The anode terminal of the first protection diode 12 is coupled to the input/output pad 14 and the cathode terminal of the first protection diode 12 is coupled to the first supply line 16. The cathode terminal of the second protection diode 18 is coupled to the input/output pad 14 and the anode terminal of the second protection diode 18 is coupled to the second supply line 20. The input/output pad 14 is coupled to functional circuitry 26 of the integrated circuit that is power supplied from the first and second supply lines. A diode 32 has a cathode terminal coupled to the first supply line 16 and an anode terminal coupled to the second supply line 20. The device 50 further includes the switching circuit 34 coupled between the first and second supply lines 16 and 20, respectively. The first conduction terminal 36 of the switching circuit 34 is coupled to the first supply line 16 and the second conduction terminal 38 of the switching circuit 34 is coupled to the second supply line 20. The control terminal 40 of the switching circuit 34 receives the trigger signal generated by the trigger circuit 44.

FIG. 4 shows a circuit diagram for an ESD protection network 80. The network 80 is formed from the combined use of the devices 10, 30 and 50. Operation of the network 80 to perform ESD protection may be better understood through reference to an example. Consider a positive ESD event at the input/output pad 14a. The ESD event transient will forward bias the diode 12a and be passed to the first supply line 16. The trigger circuit 44 senses the transient voltage difference in the first or second supply lines 16 and 20, respectively, and asserts the trigger signal in response to the sensed difference. The trigger signal actuates the switching circuit 34 to pass the ESD event transient to the second supply line 20. The diode 18b is then forward biased to pass the ESD event transient to ground through pad 14b.

SUMMARY

In an embodiment, a circuit comprises: a first power supply line; a second power supply line; an input/output node; a first tunneling field effect transistor (TFET) device having a first conduction terminal electrically coupled to the first power supply line and a second conduction terminal electrically coupled to the input/output node; a second TFET device having a first conduction terminal electrically coupled to the input/output node and a second conduction terminal electrically coupled to the second power supply line; and a trigger circuit configured to generate one or more trigger signals for application to control terminals of the first and second TFET devices.

In an embodiment, a circuit comprises: a first power supply line; an input/output node; a protection diode having a cathode terminal connected to the input/output node and an anode terminal connected to the first power supply line; a silicon controlled rectifier (SCR) device having an anode terminal connected to the input/output node and a cathode terminal connected to the first power supply line, the SCR device having a first internal node and a second internal node; and a TFET device having a first conduction terminal connected to the first internal node and a control terminal connected to the first internal node.

In an embodiment, a circuit comprises: a first power supply line; an input/output node; a protection diode having a first terminal electrically coupled to the input/output node and a second terminal electrically coupled to the first power supply line; a silicon controlled rectifier (SCR) device having an anode terminal electrically coupled to the input/output node and a cathode terminal electrically coupled to the first power supply line, the SCR device having a first internal node; and a TFET device having a first conduction terminal electrically coupled to the internal node, a second conduction terminal electrically coupled to the first power supply line and a control terminal coupled to first internal node.

In an embodiment, a circuit comprises: a first power supply line; an input/output node; a protection diode having a first terminal electrically coupled to the input/output node and a second terminal electrically coupled to the first power supply line; a silicon controlled rectifier (SCR) device having an anode terminal electrically coupled to the input/output node and a cathode terminal electrically coupled to the first power supply line, the SCR device having a first internal node and a second internal node; and a TFET device having a first conduction terminal electrically coupled to the first internal node, a second conduction terminal electrically coupled to the second internal node and a control terminal coupled to first internal node.

In an embodiment, a circuit comprises: a first power supply line; an input/output node; a gate grounded impact ionization MOSFET (GGIMOS) device having a drain terminal electrically coupled to the input/output node and a source terminal electrically coupled to the first power supply line; wherein a gate terminal of the GGIMOS device is electrically coupled to the first power supply line; and wherein the GGIMOS device comprises a source region of a first conductivity type, a drain region of a second conductivity type opposite the first conductivity type and a channel region with an insulated gate positioned over the channel region, said insulated gate positioned adjacent to the source region and offset from the drain region.

In an embodiment, a circuit comprises: a first power supply line; an input/output node; a protection circuit having a first terminal electrically coupled to the input/output node and a second terminal electrically coupled to the first power supply line; a silicon controlled rectifier (SCR) device having an anode terminal electrically coupled to the input/output node and a cathode terminal electrically coupled to the first power supply line, the SCR device having a first internal node; and a first gate grounded impact ionization MOSFET (GGIMOS) device having a drain terminal electrically coupled to the internal node, a source terminal electrically coupled to the first power supply line and a gate terminal electrically coupled to the first power supply line.

In an embodiment, a circuit comprises: a first power supply line; an input/output node; a protection device having a first terminal electrically coupled to the input/output node and a second terminal electrically coupled to the first power supply line; a silicon controlled rectifier (SCR) device having an anode terminal electrically coupled to the input/output node and a cathode terminal electrically coupled to the first power supply line, the SCR device having a first internal node and a second internal node; and a first gate grounded impact ionization MOSFET (GGIMOS) device having a drain terminal electrically coupled to the first internal node, a source terminal electrically coupled to the second internal node and a gate terminal electrically coupled to one of the first and second internal nodes.

In an embodiment, a circuit comprises: a first power supply line; a second power supply line; a tunneling field effect transistor (TFET) device having a first conduction terminal electrically coupled to the first power supply line and a second conduction terminal electrically coupled to the second power supply line; and a trigger circuit electrically coupled to the first and second power supply lines and configured to generate a trigger signal for application to a control terminal of the TFET device.

In an embodiment, a circuit comprises: a first power supply line; a second power supply line; an impact ionization MOSFET (IMOS) device having a drain conduction terminal electrically coupled to the first power supply line and a source conduction terminal electrically coupled to the second power supply line; and a trigger circuit electrically coupled to the first and second power supply lines and configured to generate a trigger signal for application to a control terminal of the IMOS device.

In an embodiment, a circuit comprises: a first power supply line; a second power supply line; an input/output node; a first impact ionization MOSFET (IMOS) device having a drain terminal electrically coupled to the first power supply line and a source terminal electrically coupled to the input/output node; a second IMOS device having a drain terminal electrically coupled to the input/output node and a source terminal electrically coupled to the second power supply line; and a trigger circuit configured to generate one or more trigger signals for application to control terminals of the first and second IMOS devices.

In an embodiment, a circuit comprises: a first power supply domain, including: a first power supply line; and a second power supply line; a second power supply domain, including: a first power supply line; and a second power supply line; a cutter circuit electrically coupled between the second power supply line of the first power supply domain and the second power supply line of the second power supply domain, wherein the cutter circuit comprises: a first tunneling field effect transistor (TFET) device having a first conduction terminal electrically coupled to the second power supply line of the first power supply domain, a second conduction terminal electrically coupled to the second power supply line of the second power supply domain and a gate terminal coupled the second power supply line of the first power supply domain; and a second TFET device having a first conduction terminal electrically coupled to the second power supply line of the second power supply domain, a second conduction terminal electrically coupled to the second power supply line of the first power supply domain and a gate terminal coupled to second power supply line of the second power supply domain.

In an embodiment, a circuit comprises: a first power supply line; a second power supply line; a third line; a first tunneling field effect transistor (TFET) device having a first conduction terminal electrically coupled to the first power supply line, a second conduction terminal electrically coupled to the third and a control terminal electrically coupled to the second power supply line; and a second TFET device having a first conduction terminal electrically coupled to the third line and a second conduction terminal electrically coupled to the second power supply line and a control terminal electrically coupled to the second power supply line.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 5:
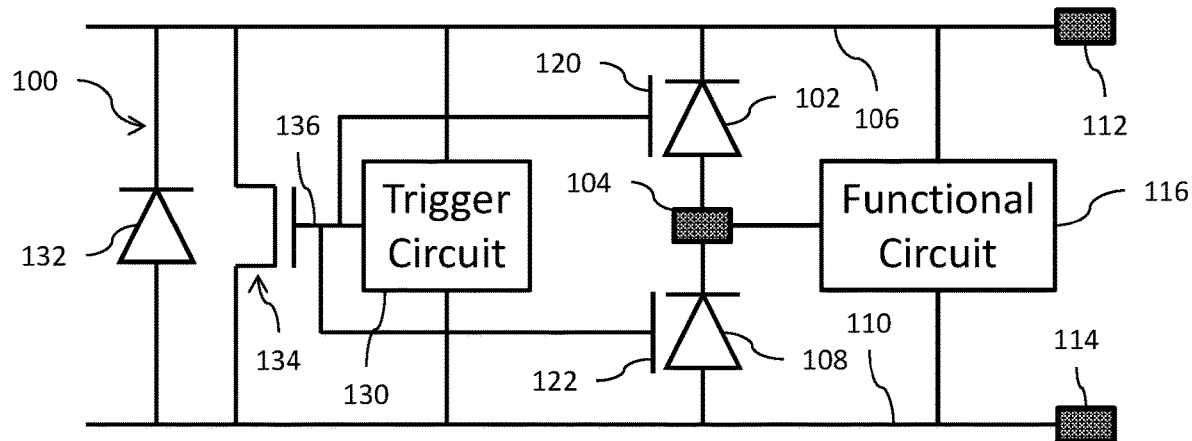
FIG. 5 shows a circuit diagram for an ESD protection device using tunneling field effect transistor (TFET) devices.

Reference is now made to FIG. 5 which shows a circuit diagram for an ESD protection device 100 using tunneling field effect transistor (TFET) devices. The device 100 is formed by a first TFET device 102 coupled between an input/output pad 104 and a first supply line 106 of an integrated circuit, and a second TFET device 108 coupled between the input/output pad 104 and a second supply line 110 of the integrated circuit. The first TFET device 102 has a drain terminal coupled to the input/output pad 104 and a source terminal coupled to the first supply line 106. The second TFET device 108 has a source terminal coupled to the input/output pad 104 and a drain terminal coupled to the second supply line 110. In this implementation, the first supply line 106 may be coupled to a positive power supply pad 112 for the integrated circuit and the second supply line 110 may be coupled to a negative or ground power supply pad 114 for the integrated circuit. The input/output pad 104 is coupled to functional circuitry 116 of the integrated circuit that is power supplied from the first and second supply lines. A gate terminal 120 of the first TFET device 102 receives a trigger signal 136 and a gate terminal 122 of the second TFET device 108 also receives the trigger signal 136. The trigger signal 136 is generated by a trigger circuit 130 that senses a transient voltage difference on the first or second supply lines 106 and 110 and asserts the trigger signal 136 to turn on one or more of the first and second TFET devices, 102 and 108, respectively, in response to the sensed difference.

The device 100 further includes a diode 132 coupled between the first and second supply lines 106 and 110, respectively, and a transistor switching circuit 134 also coupled between the first and second supply lines 106 and 110, respectively. The anode of diode 132 is coupled to line 110 and the cathode of diode 132 is coupled to line 106. The transistor switching circuit 134 may be implemented as a MOSFET device (as shown), or alternatively could be a triac device. The gate (or control) terminal of the transistor switching circuit 134 is coupled to receive the trigger signal 136 generated by the trigger circuit 130, with one conduction terminal of circuit 134 coupled to line 110 and another conduction terminal of circuit 134 coupled to line 106.

Figure 6:
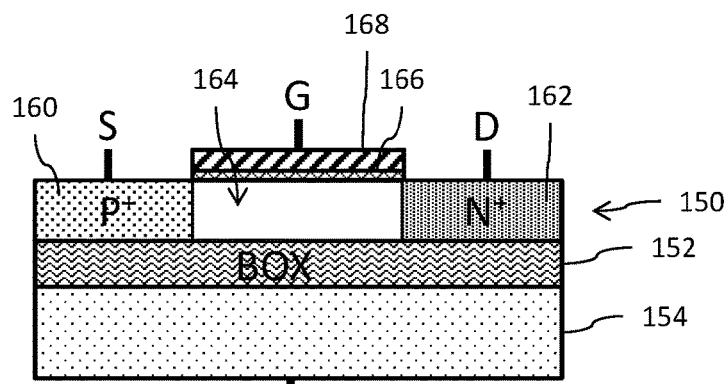
FIG. 6 shows a cross-sectional diagram of an integrated TFET device implemented on a fully depleted silicon on insulator (FDSOI) substrate.
Figure 7:
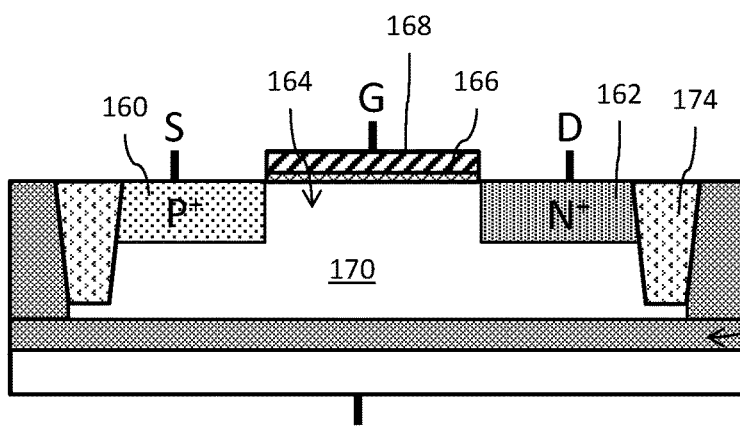
FIG. 7 shows a cross-sectional diagram of an integrated TFET device implemented on a bulk substrate.

FIG. 6 shows a cross-sectional diagram of an integrated TFET device implemented on a fully depleted silicon on insulator (FDSOI) substrate. FIG. 7 shows a cross-sectional diagram of an integrated TFET device implemented on a bulk substrate.

A TFET device is a gated diode device biased in the reverse bias mode. The source 160 of the TFET device corresponds to the cathode and the drain 162 of the TFET device corresponds to the anode of the gated diode. The source 160 region of the TFET device has a first conductivity type (for example, p-type) and is heavily doped. The drain 162 region of the TFET device has a second (opposite) conductivity type (for example, n-type) and is also heavily doped. The channel 164 region of the TFET device is generally intrinsic semiconductor material (or very lightly doped material). In an embodiment, the channel 164 region may be lightly doped with a same conductivity type (for example, p-type) as the source. Alternatively, the channel 164 region may be lightly doped with a same conductivity type (for example, n-type) as the drain. The gate electrode 168 is insulated from the channel region by a gate dielectric layer 166.

In the implementation of FIG. 6, the source, channel and drain regions are formed in the intrinsic semiconductor layer 150 over the buried oxide layer (BOX) 152. The substrate 154 supporting the buried oxide layer may, if desired, be biased.

In the implementation of FIG. 7, the bulk substrate may be either intrinsic or lightly doped (for example, p-type) semiconductor material. The p-type body 170 of the TFET device is isolated by a deep well 172 doped with a conductivity type (for example, n-type) opposite the conductivity type of the substrate (for example, p-type). The drain 162 region of the TFET device has the same second conductivity type as the deep well 172, but may have a different doping level (for example, lighter). Shallow trench isolations 174 delimit the body 170. The portion of the substrate under the deep well 172 may, if desired, be biased.

The TFET device may be implemented in any suitable substrate technology. The TFET may be implemented in using any suitable transistor configuration (planar, finFET, etc.) as desired. The finFET implementation has, for example, a cross-section similar to that shown in FIGS. 6 and 7 except that the gate oxide and gate extend to straddle over the channel region on three sides (as opposed to only the one (top) side as shown).

Figure 8:
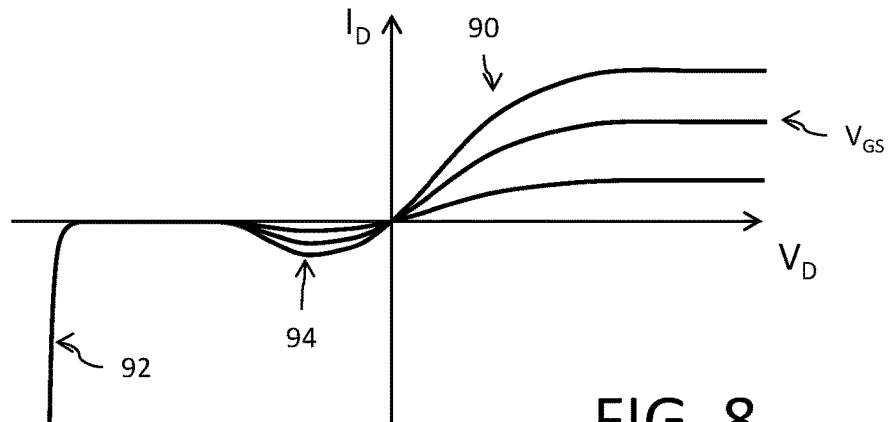
FIG. 8 illustrates the drain current-voltage operating characteristics of the TFET device.

FIG. 8 illustrates the drain current-voltage operating characteristics of the TFET. In response to positive voltage from drain to source (i.e., during reverse bias conditions) as shown at reference 90, the TFET operates in a manner similar to a MOSFET with drain current increasing with increasing drain voltage and increasing gate voltage. In response to a negative voltage from drain to source (i.e., during forward bias conditions) as shown at reference 92, the TFET operates in a manner similar to a diode with drain current increasing in response to increase in negative voltage exceeding the diode forward bias threshold (about 0.8V) regardless of gate voltage. Still further, in response to a slightly negative voltage drain to source as shown at reference 94, there is some current conduction in response to negative voltage less than the diode forward bias threshold with positive gate voltages.

Figure 9:
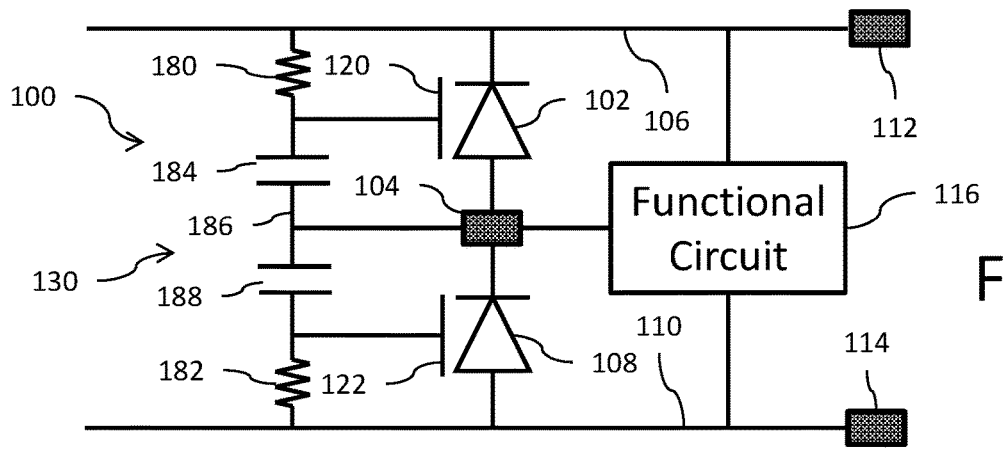
FIG. 9 shows a circuit diagram for an embodiment of a trigger circuit for the ESD protection device.

Reference is now made to FIG. 9 which shows a circuit diagram for an embodiment of a trigger circuit 130 for the ESD protection device 100. The trigger circuit 130 comprises a first resistor 180 coupled between the first supply line 106 and the gate terminal 120 of the first TFET device 102, a second resistor 182 coupled between the second supply line 110 and the gate terminal 122 of the second TFET device 108, a first capacitor 184 coupled between the gate terminal 120 of the first TFET device 102 and a node 186, and a second capacitor 188 coupled between the gate terminal 122 of the second TFET device 108 and the node 186. The node 186 is coupled to the input/output pad 104. In this embodiment, the trigger signals are generated in response to a change in potential at the input/output pad 104 compared to the first and second supply lines 106 and 110.

Operation of the device 100 with the trigger circuit 130 of FIG. 9 may be better understood with reference to an example. Consider a positive ESD event at the input/output pad 104. The ESD event transient is passed by the capacitor 188 and a voltage is developed across resistor 182 to generate a positive trigger signal turning on the second TFET device 108 (reference 90, FIG. 8) to dissipate the ESD event to the second supply line 110. Conversely, with a negative ESD event at the input/output pad 104, the diode of the second TFET device 108 becomes forward biased (reference 92, FIG. 8). The devices operate in an opposite manner for a positive ESD event.

Figure 10:
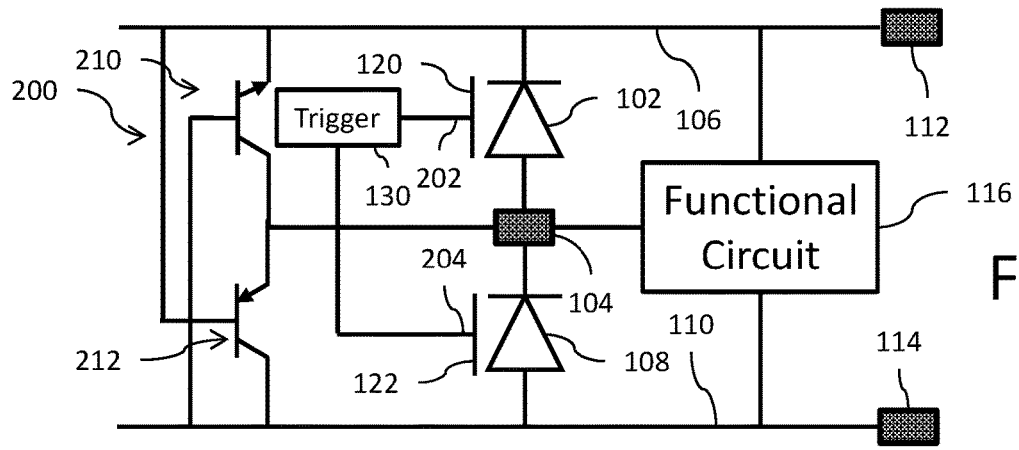
FIG. 10 shows a circuit diagram for an ESD protection device using TFET devices with parasitic bipolar transistors in parallel.

Reference is now made to FIG. 10 which shows a circuit diagram for an ESD protection device 200 using tunneling field effect transistor (TFET) devices. Like reference numbers refer to like or similar components whose description, for the sake of brevity, is not repeated (see, discussion of FIG. 5, for example). The gate terminals of the first and second TFET devices 102 and 108 each receive a trigger signal on trigger lines 202 and 204, respectively, generated by the trigger circuit 130 (having a configuration, for example, like that shown in FIGS. 5 and 9). The first and second TFET devices 102 and 108, respectively, are implemented in a manner such that each TFET device includes a parallel connected parasitic bipolar transistor. For example, the first TFET device 102 includes a parasitic NPN bipolar transistor 210 having an emitter coupled to the first supply line 106 and a collector coupled to the input/output pad 104. A base of the parasitic NPN bipolar transistor 210 is coupled to the second supply line 110. The second TFET device 108 includes a parasitic PNP bipolar transistor 212 having an emitter coupled to the input/output pad 104 and a collector coupled to the second supply line 110. A base of the parasitic PNP bipolar transistor 212 is coupled to the first supply line 106.

Figure 11A:
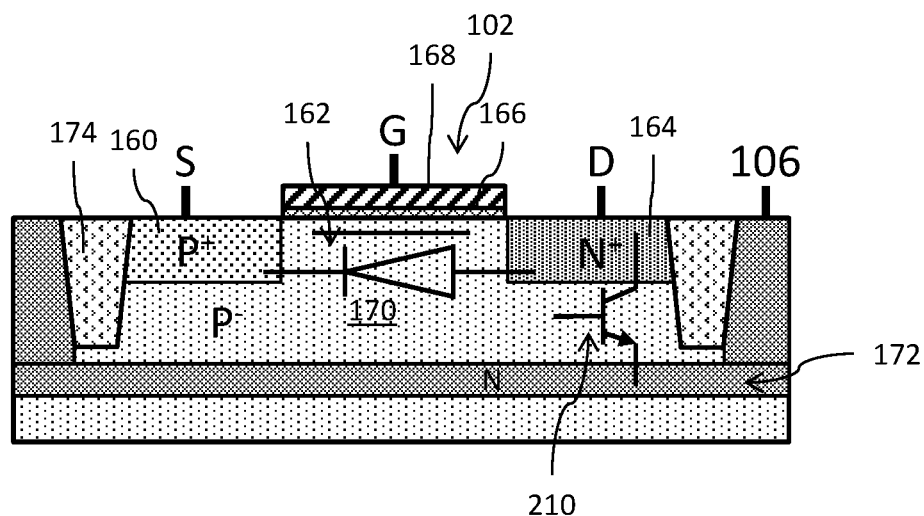
FIGS. 11A-11B show cross-sectional diagram of integrated TFET devices for use in the device of FIG. 10.

Reference is now made to FIG. 11A showing a cross-sectional diagram of an integrated TFET device with a parasitic vertical NPN bipolar transistor. This integrated TFET device can be used to provide the first TFET device 102 with parasitic NPN bipolar transistor 210 as shown in FIG. 10. Here, the body 170 provides the base of the parasitic NPN bipolar transistor 210, with the deep N-well 172 providing the emitter of the parasitic NPN bipolar transistor 210. The drain 164 region provides the collector of transistor 210.

Figure 11B:
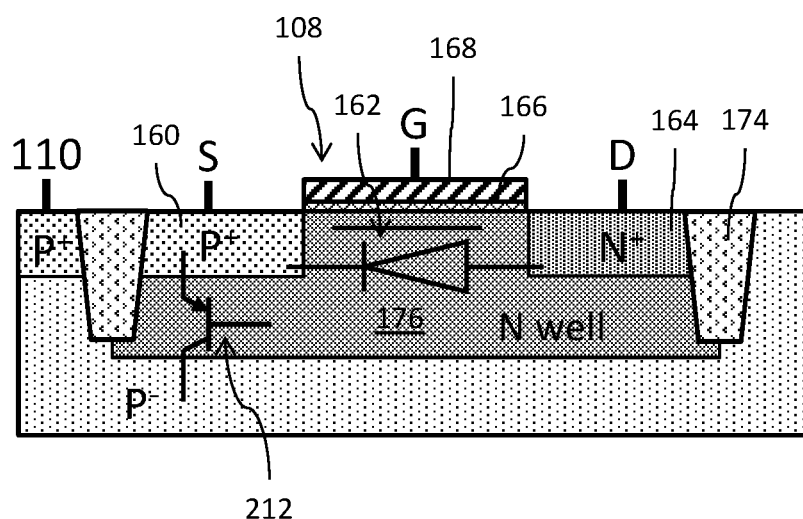

Reference is now made to FIG. 11B showing a cross-sectional diagram of an integrated TFET device with a parasitic vertical PNP bipolar transistor. This integrated TFET device can be used to provide the second TFET device 108 with parasitic PNP bipolar transistor 212 as shown in FIG. 10. Here, the body of the second TFET device 108 and base of the parasitic PNP bipolar transistor 212 is provided by an N-well 176 formed within the p-type substrate. The source 160 region provides the emitter and the substrate provides the collector.

Operation of the device 200 may be better understood by reference to an example. If a negative ESD event occurs at the input/output pad 104, the diode of the second TFET device 108 becomes forward biased (reference 92, FIG. 8) and the first TFET device 102 operates in TFET mode (reference 90, FIG. 8) actuated in response to the trigger signal on trigger line 202 to provide an additional path for ESD discharge through the first supply line 106. In addition, the parasitic NPN bipolar transistor 210 is turned on providing an additional discharge path to the first supply line 106. The devices operate in an opposite manner for a positive ESD event.

Figure 12:
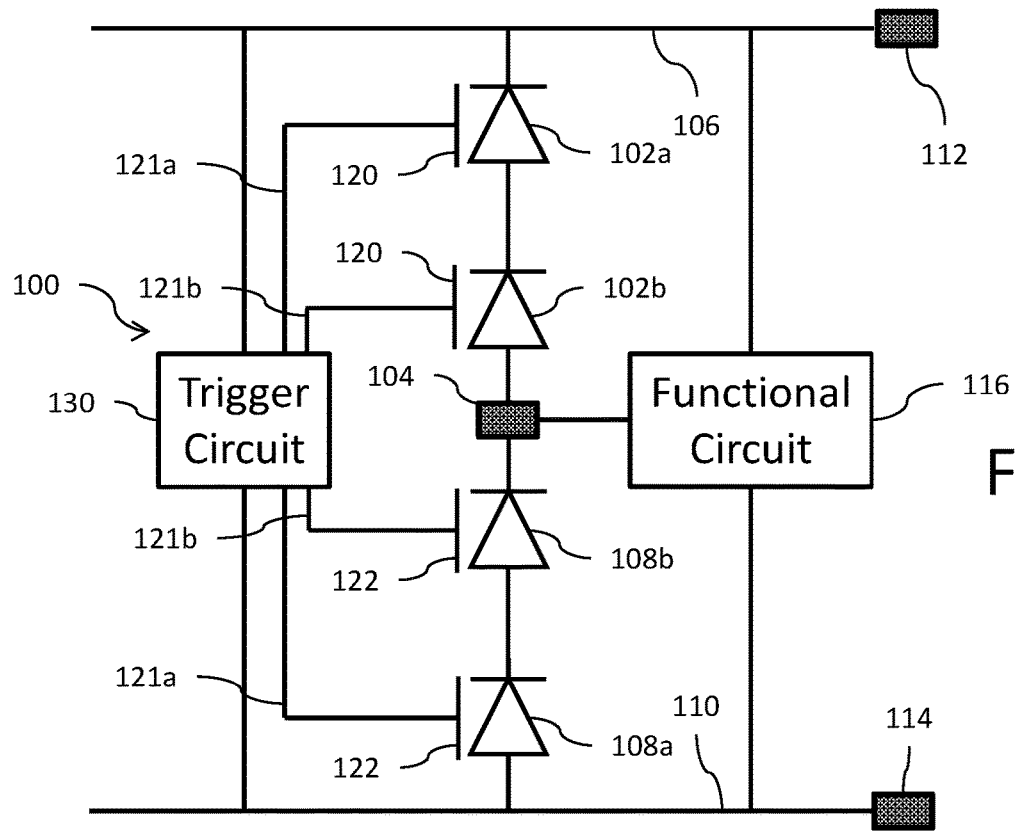
FIG. 12 shows a circuit diagram for an ESD protection device using cascaded TFET devices.

For higher voltage ratings, multiple TFET devices may be connected in cascade as shown in FIG. 12. Thus, two series connected TFET devices 102a and 102b are coupled between the first supply line 106 and the input/output pad 104, and two series connected TFET devices 108a and 108b are coupled between the second supply line 108 and the input/output pad 104. The gates of the included TFET devices are coupled to the output of the trigger circuit 130. In a preferred implementation, the trigger signal 121a is generated by the trigger circuit and applied to both of the TFET devices 102a and 108a, and the trigger signal 121b is generated by the trigger circuit and applied to both of the TFET devices 102b and 108b. The signals 121a and 121b are separate signals in an embodiment.

Figure 13A:
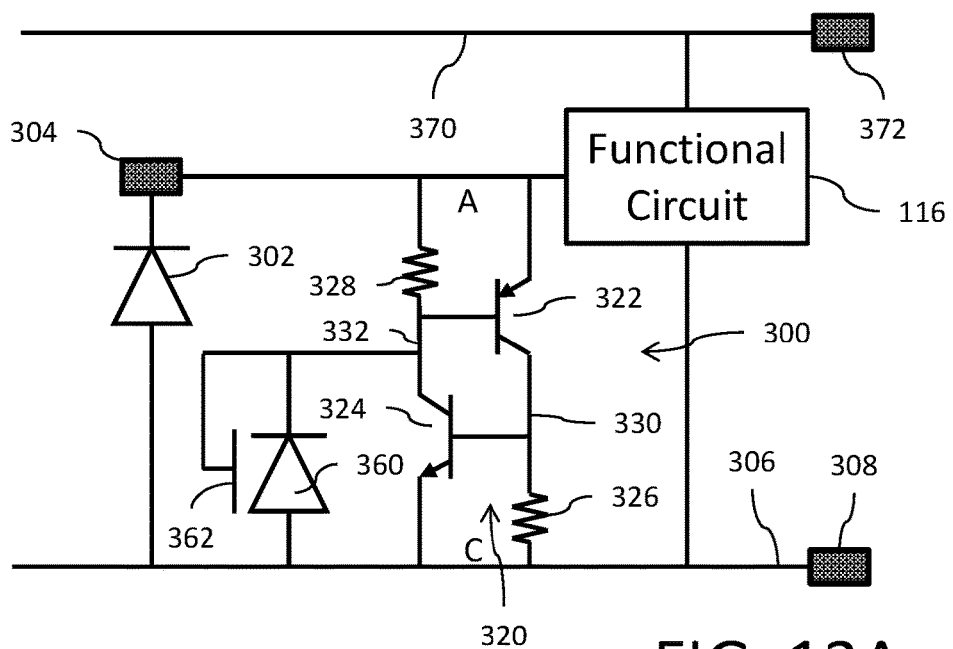
FIGS. 13A-13B show circuit diagrams for an ESD protection device using TFET devices coupled to a silicon controller rectifier (SCR) device.

Reference is now made to FIG. 13A which shows a circuit diagram for an ESD protection device 300 using a tunneling field effect transistor (TFET) device coupled to a silicon controller rectifier (SCR) device. The device 300 is formed by a protection diode 302 coupled between an input/output pad 304 and a supply line 306 of an integrated circuit. The protection diode 302 has a cathode coupled to the input/output pad 304 and an anode coupled to the supply line 306. In this embodiment, the supply line 306 may be coupled to a ground power supply pad 308 for the integrated circuit. The input/output pad 304 is coupled to functional circuitry 116 that is also coupled to the supply line 306 and is powered from supply line 370 and pad 372 which may receive a positive voltage.

The device 300 further includes an SCR 320 having an anode terminal (A) coupled to the input/output pad 304 and a cathode terminal (C) coupled to the supply line 306. The SCR 320 is an integrated device formed by a bipolar PNP transistor 322, a bipolar NPN transistor 324, a first substrate resistance 326 and a second substrate resistance 328. The emitter of the bipolar PNP transistor 322 is coupled to the input/output pad 304 and the collector of the bipolar PNP transistor 322 is coupled to a first node 330. The first substrate resistance 326 is coupled between the first node 330 and the supply line 306. The emitter of the bipolar NPN transistor 324 is coupled to the supply line 306 and the collector of the bipolar NPN transistor 324 is coupled to a second node 332. The second substrate resistance 328 is coupled between the second node 332 and the input/output pad 304.

Figure 14:
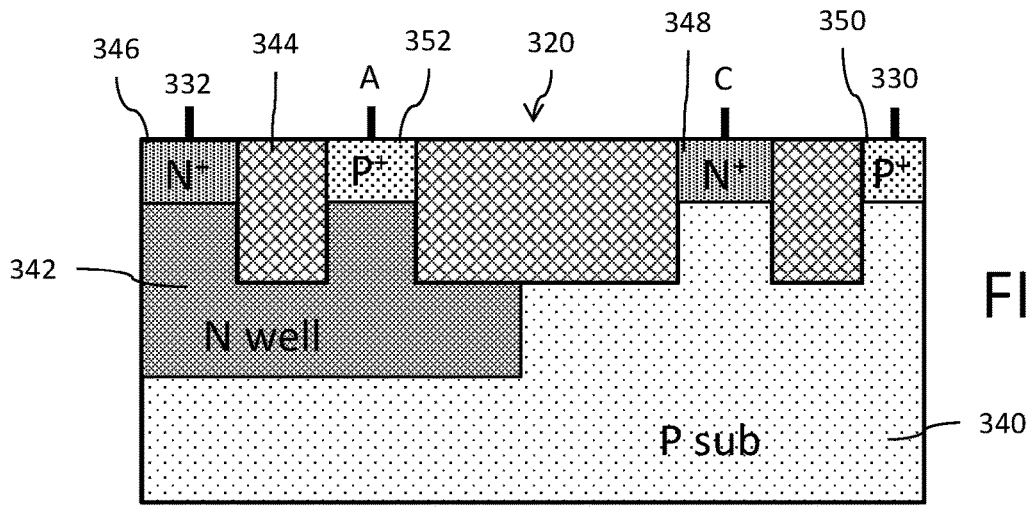
FIG. 14 is a cross-sectional diagram of an integrated circuit implementation of the SCR device.

A cross-sectional diagram of an integrated circuit implementation of the SCR 320 is shown in FIG. 14. A semiconductor substrate 340 is lightly doped with a p-type dopant. A well 342 is formed in the substrate 340 and doped with an n-type dopant. Insulating trenches 344 are provided in the upper surface of the substrate 340. A heavily doped n-type region 346 provides the node 322 and another heavily doped n-type region 348 provides the emitter of the bipolar NPN transistor 324. A heavily doped p-type region 350 provides the node 320 and another heavily doped p-type region 350 provides the emitter of the bipolar PNP transistor 322. The semiconductor substrate 340 provides the first substrate resistance 326 and base of the bipolar PNP transistor 322. The well 342 provides the second substrate resistance 328 and base of the bipolar NPN transistor 324.

Reference is once again made to FIG. 13A. The device 300 further includes a TFET device 360 coupled between node 332 and the supply line 306 to function as the triggering circuit for the SCR 320 device. The TFET device 360 has a source terminal coupled to the node 332 and a drain terminal coupled to the supply line 306. A gate terminal 362 of the second TFET device 360 is coupled to the node 332.

Figure 15A:
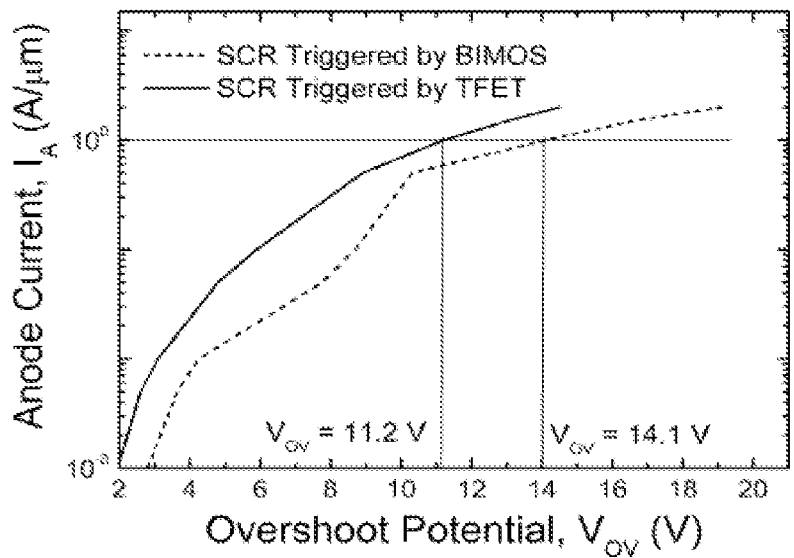
FIGS. 15A-15B plots anode current versus overshoot potential with respect to the circuit of FIG. 13.
Figure 15B:
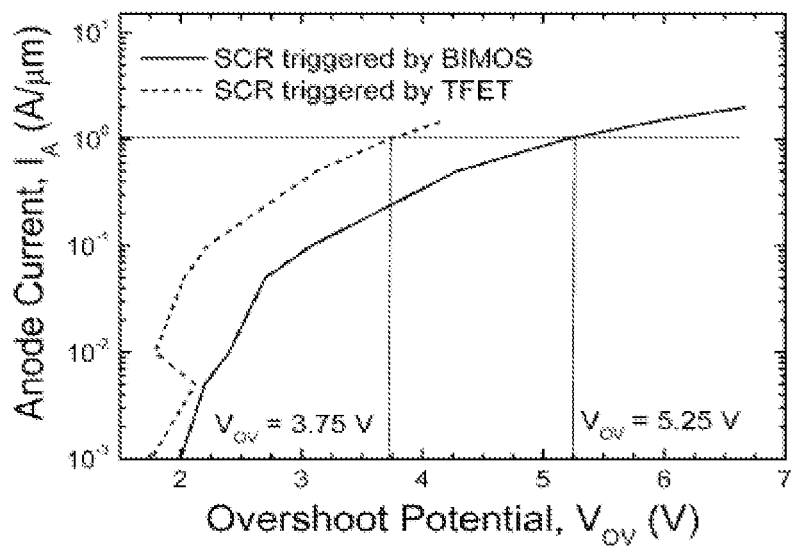

In an alternative implementation, the SCR 320 device can instead be triggered in a conventional manner without using the second TFET device 360. SCR triggering circuits for ESD protection are well known in the art. However, as shown in FIGS. 15A-15B, there is an improvement in performance if the SCR is triggered by the TFET 360 instead of a BIMOS (where FIG. 15A plots anode current versus overshoot potential during very fast transmission line pulsing—VFTLP—and FIG. 15B plots anode current versus overshoot potential during transmission line pulsing—TLP).

It is also possible to implement the TFET and SCR circuit shown in FIG. 13A between the input/output pad 304 and the supply line 370 coupled to power supply pad 372.

Figure 13B:
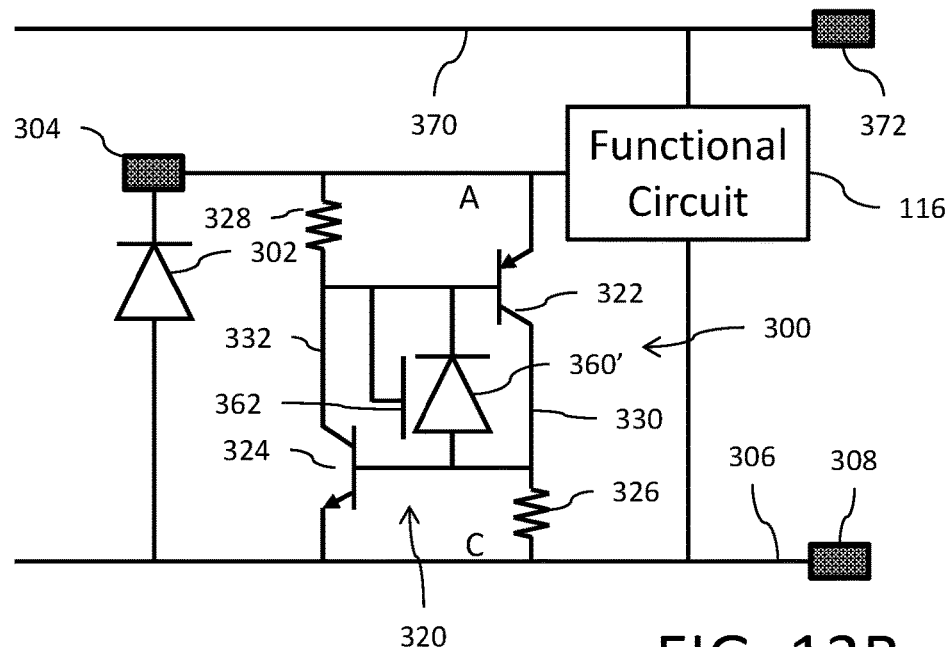

Reference is now made to FIG. 13B showing an alternative configuration. Like reference numbers refer to like or similar components of FIG. 13A and will not be further discussed. The circuit of FIG. 13B differs from the circuit of FIG. 13A with respect to the triggering of the SCR device 320. The triggering TFET 360' is coupled between node 332 and node 330. The gate terminal 362 of the TFET device 360' is coupled to the node 332.

Figure 13C:
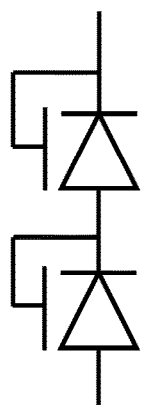
FIG. 13C shows a cascade of TFET devices for an SCR triggering circuit.

In both FIGS. 13A and 13B, in an implementation for high voltage applications, the single TFET device 360 or 360' may instead be configured as a cascade of two or more TFET devices as shown in FIG. 13C.

Figure 16A:
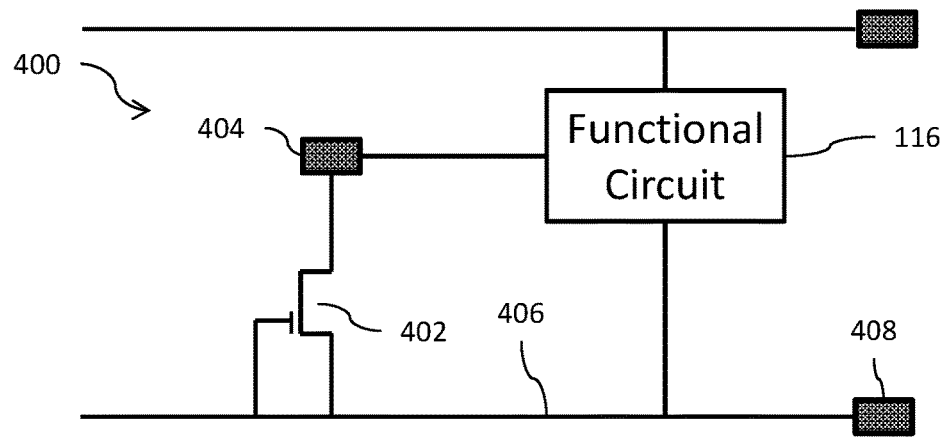
FIGS. 16A-16B show an input/output pad clamp device using a gate grounded impact ionization MOSFET (GGI-MOS)

Reference is now made to FIG. 16A showing an input/output pad clamp device 400. The device 400 is formed by a gate grounded impact ionization MOSFET (GGIMOS) 402 coupled between an input/output pad 404 and a supply line 406 of an integrated circuit. The GGIMOS device 402 has a drain terminal coupled to the input/output pad 404 and a source terminal coupled to the supply line 406. In this embodiment, the supply line 406 may be coupled to a ground power supply pad 408 for the integrated circuit. The input/output pad 404 is coupled to functional circuitry 116 that is also coupled to the supply line 406.

Figure 17A:
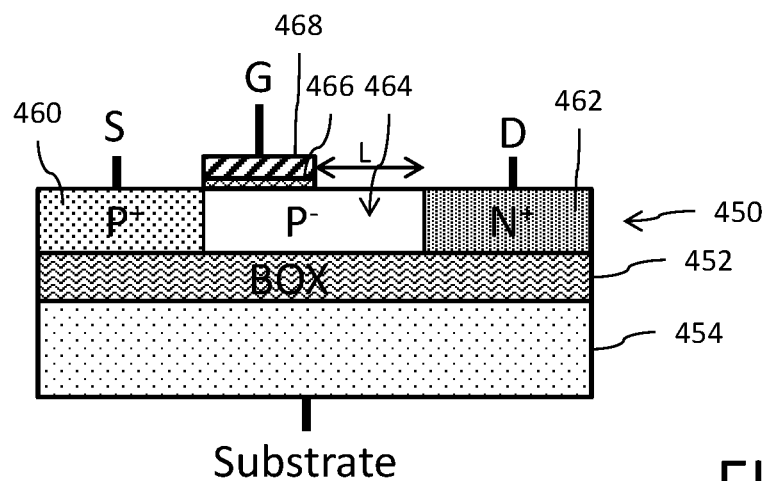
FIGS. 17A-17B are cross-sectional diagrams IMOS devices implemented on an FDSOI substrate.
Figure 17B:
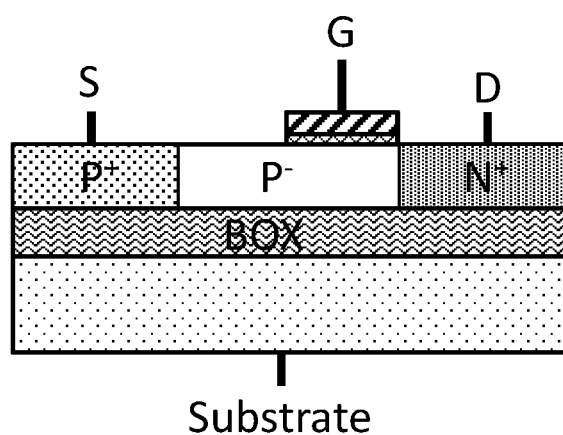

FIG. 17A shows a cross-sectional diagram of an integrated impact ionization MOSFET (IMOS) implemented on a fully depleted silicon on insulator (FDSOI) substrate. The IMOS is a partially covered gated diode device biased in the reverse bias mode. The source 460 of the IMOS device corresponds to the cathode and the drain 462 corresponds to the anode of the gated diode. The source 460 region of the IMOS device has a first conductivity type (for example, p-type) and is heavily doped. The drain 462 region of the IMOS device has a second (opposite) conductivity type (for example, n-type) and is also heavily doped. The channel 464 region of the TFET device is generally intrinsic semiconductor material. In an embodiment, the channel 464 region may be lightly doped with a same conductivity type (for example, p-type) as the source. The gate 468 is insulated from the channel region by a gate dielectric layer 466. As noted above, the IMOS is a partially covered gated diode device. In this IMOS configuration, the gate 468 only partially covers the channel 464 region and is specifically positioned adjacent to the source 460 region and is offset from the drain 462 region by a distance L that is, for example, less than or equal to one-half of the overall gate length and more than or equal to one-quarter of the overall gate length. This positioning differs from conventional IMOS designs (FIG. 17B) which position the partially covering gate structure adjacent to the drain region. The source, channel and drain regions are formed in the intrinsic semiconductor layer 450 over the buried oxide layer (BOX) 452. The substrate 454 supporting the buried oxide layer may, if desired, be biased.

A number of advantages accrue from use of the IMOS device of 402. Gate oxide stress is reduced in comparison to the conventional IMOS design. Furthermore, in the gate grounded configuration (GGIMOS) there is no need for cascaded connection of multiple protection devices for high voltage operations. Additionally, there is no need to include a return diode for negative ESD stress. As a result, the overall ESD protection circuitry occupies less area. Still further, the GGIMOS device 402 does not exhibit snapback characteristics, and thus latchup is not a concern.

Figure 16B:
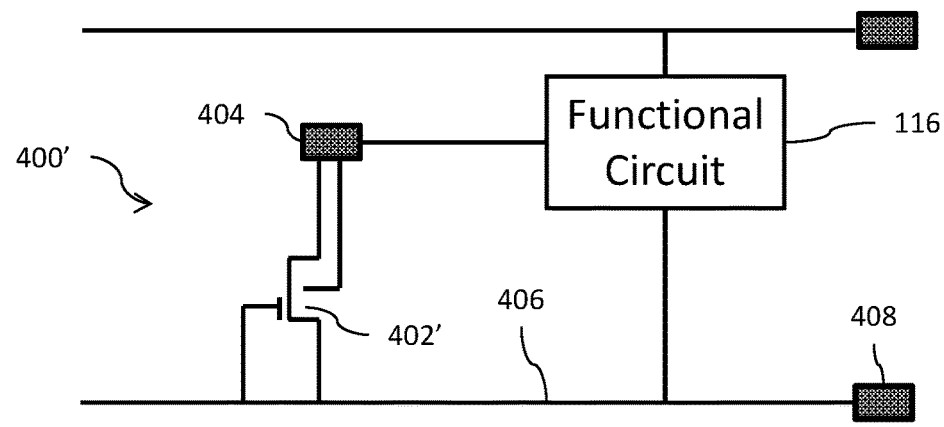

FIG. 16B shows an alternative embodiment for the input/output pad clamp device 400'. Here, the substrate 454 of the GGIMOS device 402' is coupled to the input/output pad 404. This configuration is beneficial in situations where the SOI substrate is of the ultra-thin body and thin buried oxide (UTBB) type because leakage current in the GGIMOS is higher. A reduction in this leakage current can be obtained by tying the input/output pad 404 to the substrate 454 to use the substrate 454 effectively as a back gate. Both band to band tunneling current and maximum electric field peak at the edge of the gate 468 are reduced in this configuration.

Figure 18A:
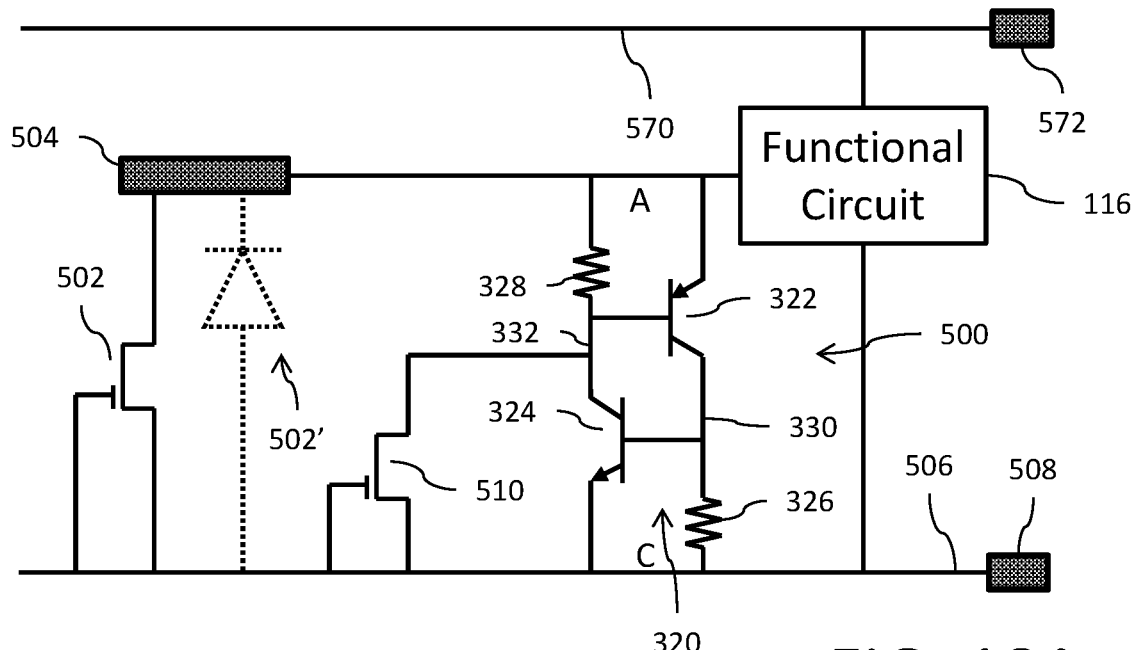
FIGS. 18A-18C show circuit diagrams for an ESD protection device using GGIMOS devices coupled to an SCR device.

Reference is now made to FIG. 18A which shows a circuit diagram for an ESD protection device 500 using gate grounded impact ionization MOSFET (GGIMOS) devices coupled to a silicon controller rectifier (SCR) device. The device 500 is formed by a first GGIMOS device 502 coupled between an input/output pad 504 and a supply line 506 of an integrated circuit. The first GGIMOS device 502 has a drain terminal coupled to the input/output pad 504 and a source terminal coupled to the supply line 506, with the gate grounded to the supply line 506. In this embodiment, the supply line 506 may be coupled to a ground power supply pad 508 for the integrated circuit. The input/output pad 504 is coupled to functional circuitry 116 that is also coupled to the supply line 506. The first GGIMOS device 502 functions here as the return diode.

The device 500 further includes an SCR 320 having an anode terminal (A) coupled to the input/output pad 504 and a cathode terminal (C) coupled to the supply line 506. The SCR 320 is an integrated device formed by a bipolar PNP transistor 322, a bipolar NPN transistor 324, a first substrate resistance 326 and a second substrate resistance 328. The emitter of the bipolar PNP transistor 322 is coupled to the input/output pad 504 and the collector of the bipolar PNP transistor 322 is coupled to a first node 330. The first substrate resistance 326 is coupled between the first node 330 and the supply line 506. The emitter of the bipolar NPN transistor 324 is coupled to the supply line 506 and the collector of the bipolar NPN transistor 324 is coupled to a second node 332. The second substrate resistance 328 is coupled between the second node 332 and the input/output pad 504. A cross-sectional diagram of an integrated circuit implementation of the SCR 320 is shown in FIG. 14 (described above).

Figure 19:
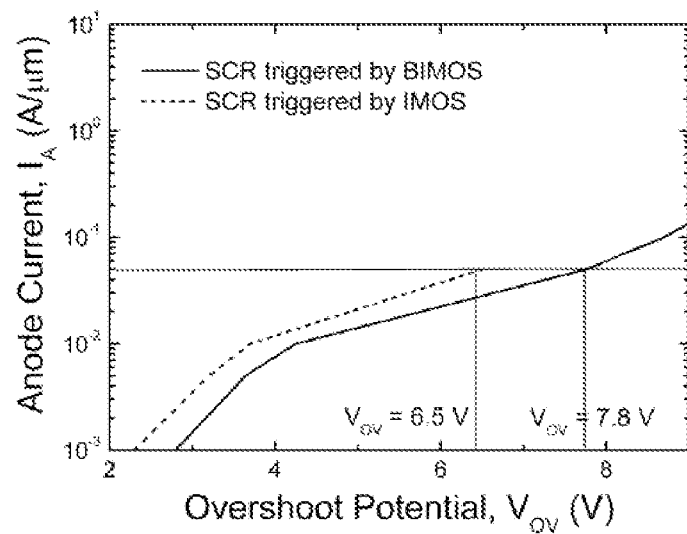
FIG. 19 plots anode current versus overshoot potential with respect to the circuit of FIG. 18.

The device 500 further includes a second GGIMOS device 510 coupled between node 322 and the supply line 506 to function as the triggering circuit for the SCR 320 device. The second GGIMOS device 510 has a drain terminal coupled to the node 332 and a source terminal coupled to the supply line 506, with the gate grounded to supply line 506. As shown in FIG. 19, there is an improvement in performance if the SCR is triggered by the GGIMOS instead of a BIMOS.

It is also possible to implement the IMOS and SCR circuit shown in FIG. 18A between the input/output pad 504 and the supply line 570 coupled to power supply pad 572.

Figure 18B:
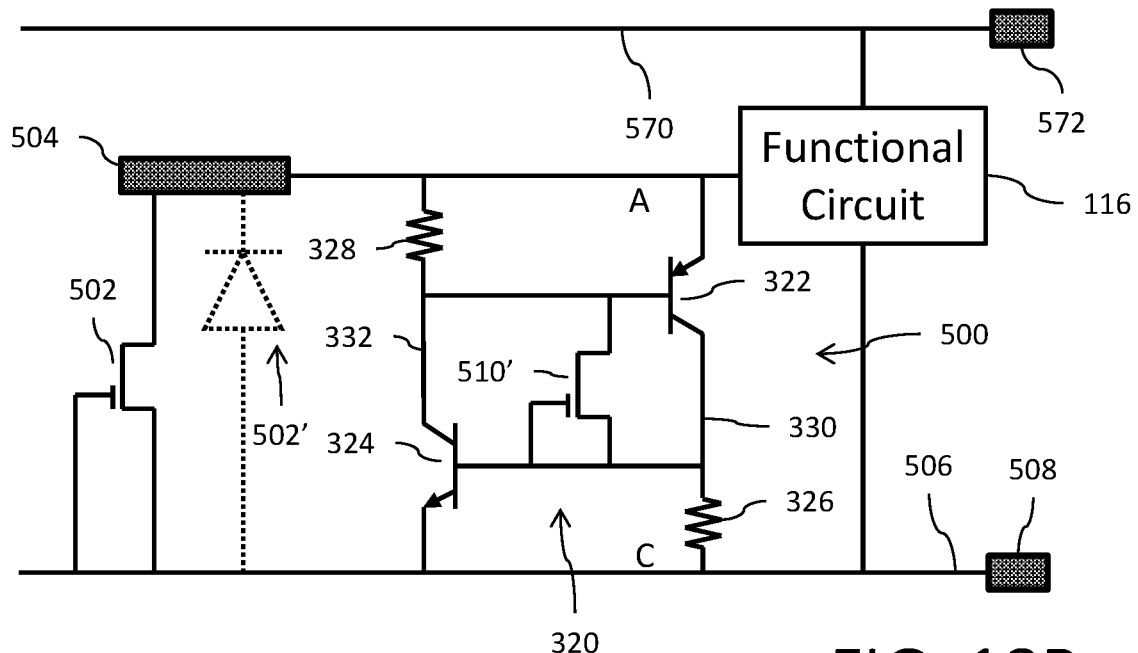

Reference is now made to FIG. 18B showing an alternative configuration. Like reference numbers refer to like or similar components of FIG. 18A and will not be further discussed. The circuit of FIG. 18B differs from the circuit of FIG. 18A with respect to the triggering of the SCR device 320. The triggering GGIMOS device 510' is coupled between node 332 and node 330. The gate terminal of the GGIMOS device 510' is coupled to the node 330.

Figure 18C:
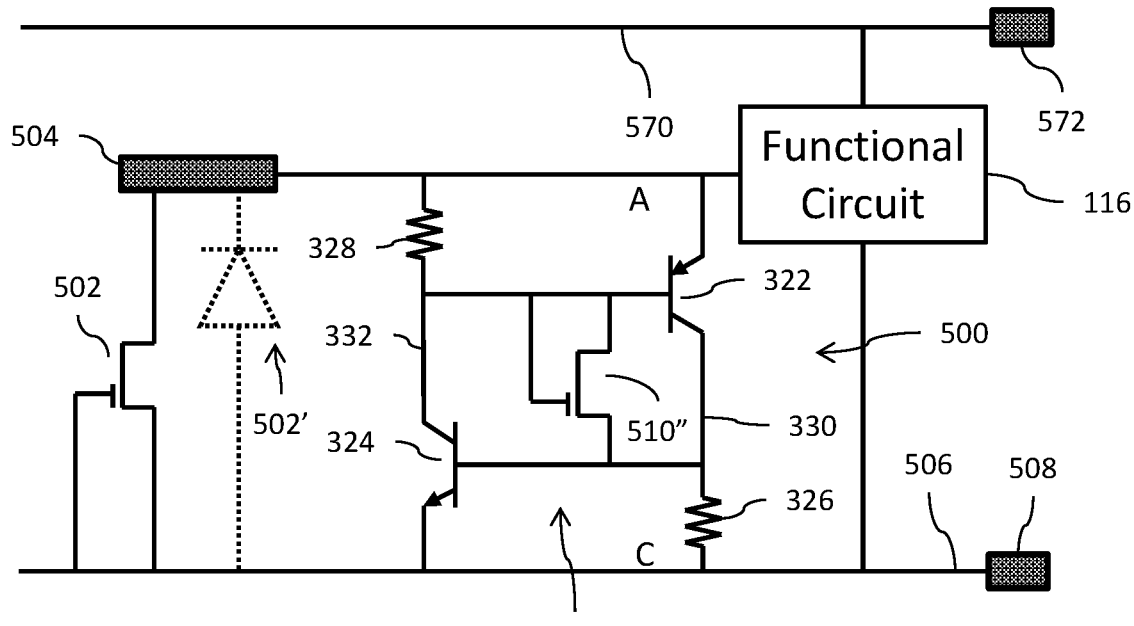

Reference is now made to FIG. 18C showing an alternative configuration. Like reference numbers refer to like or similar components of FIG. 18A and will not be further discussed. The circuit of FIG. 18C differs from the circuit of FIG. 18A with respect to the triggering of the SCR device 320. The triggering GGIMOS device 510" is coupled between node 332 and node 330. The gate terminal of the GGIMOS device 510" is coupled to the node 332.

In FIGS. 18A-18C, in alternative implementations, the first GGIMOS device 502 may instead be implemented as a protection diode 502' having a cathode terminal coupled to the input/output pad 504 and an anode terminal coupled to the supply line 506.

Figure 1:
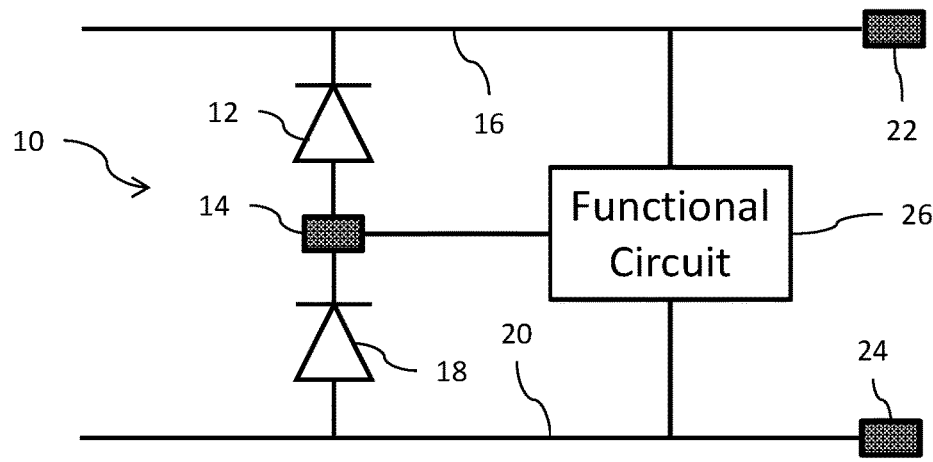
FIG. 1 shows a circuit diagram for a conventional electrostatic discharge (ESD) protection device.
Figure 2:
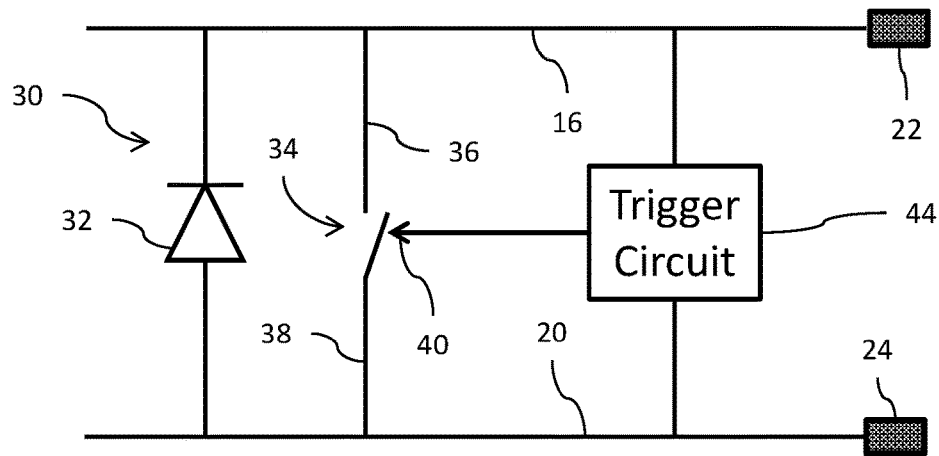
FIG. 2 shows a circuit diagram for a conventional supply clamp device.
Figure 3:
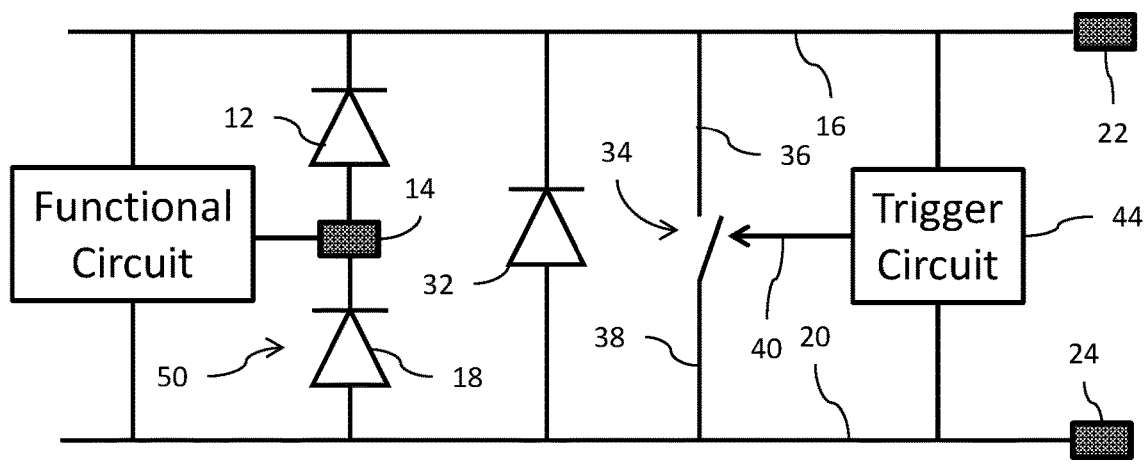
FIG. 3 shows a circuit diagram for a conventional ESD protection and clamp device.
Figure 4:
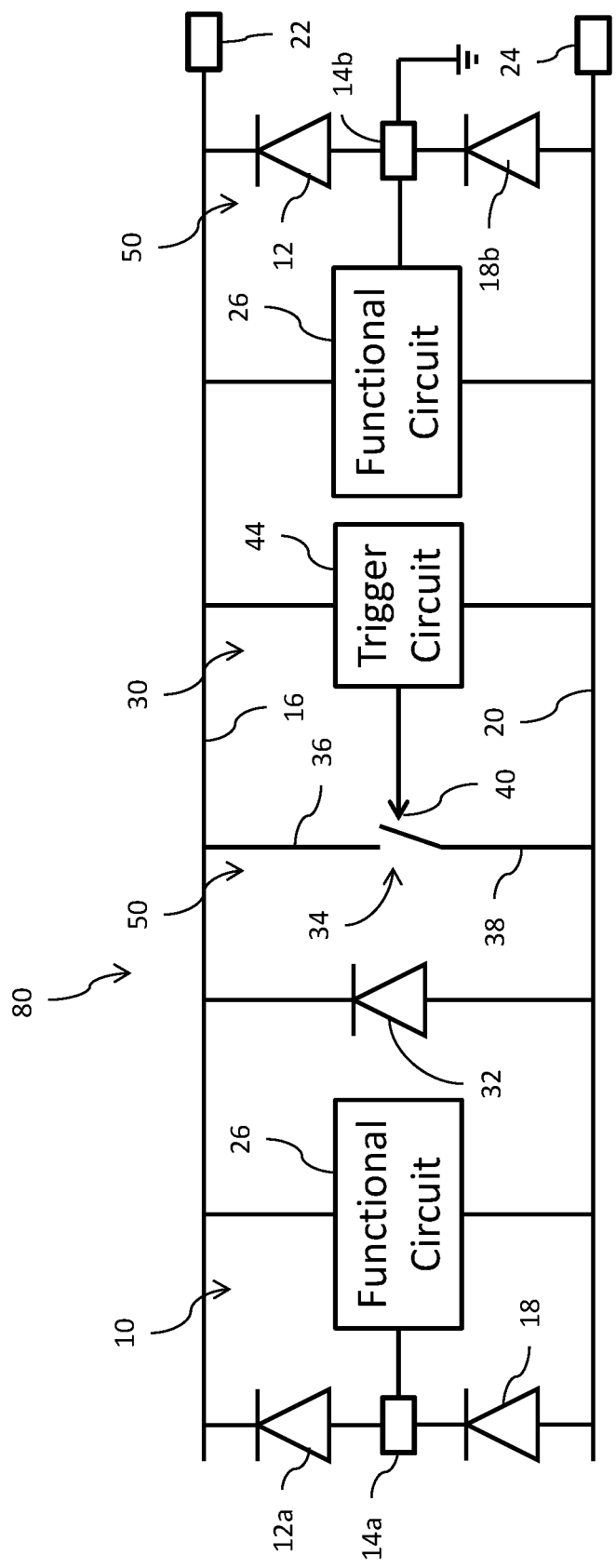
FIG. 4 shows a circuit diagram for an ESD network.
Figure 20A:
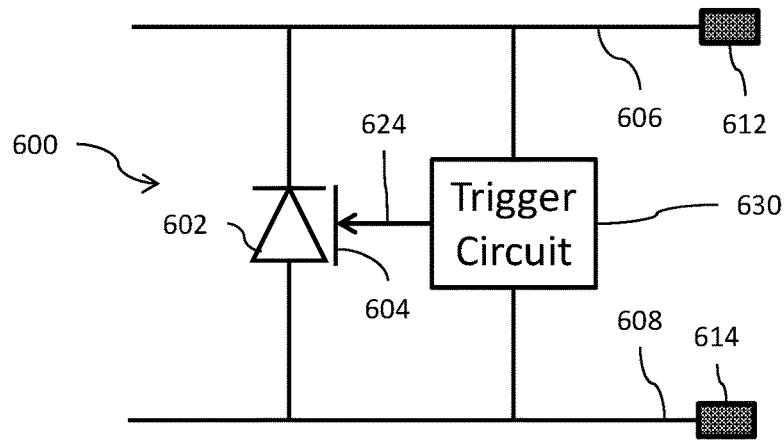
FIGS. 20A-20B show circuit diagrams for an ESD supply clamp device using a TFET device.

Reference is now made to FIG. 20A showing a circuit diagram for an ESD supply clamp device 600 using a TFET device. The device 600 is formed by a TFET device 602 coupled between a first supply line 606 of an integrated circuit and a second supply line 608 of the integrated circuit. The TFET device 602 has a source terminal coupled to the first supply line 606 and a drain terminal coupled to the second supply line 608. In this implementation, the first supply line 606 may be coupled to a positive power supply pad 612 for the integrated circuit and the second supply line 608 may be coupled to a negative or ground power supply pad 614 for the integrated circuit. A gate terminal 604 of the TFET device 602 receives a trigger signal 624. The trigger signal 624 is generated by a trigger circuit 630 that senses a transient voltage difference on the first or second supply lines 606 and 608, respectively, and asserts the trigger signal 624 to turn on the TFET device 602 in response to the sensed difference. In comparison to the prior art implementation of FIG. 2, the ESD supply clamp device 600 advantageously replaces both the return diode 32 and the switch 34.

The TFET device 602 may be implemented as shown in FIGS. 6-7 (described above).

Figure 20B:
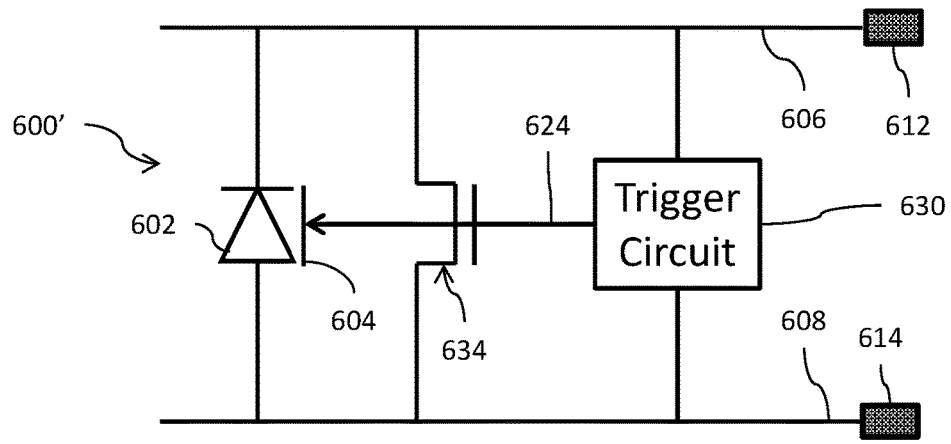

In an alternative implementation as shown in FIG. 20B, the circuit 600' further includes a transistor switching circuit 634 also coupled between the first and second supply lines 606 and 608, respectively. The transistor switching circuit 634 may be implemented as a MOSFET device (as shown), or alternatively could be a triac device. The gate (or control) terminal of the transistor switching circuit 634 is coupled to receive the trigger signal 624 generated by the trigger circuit 630.

Figure 21:
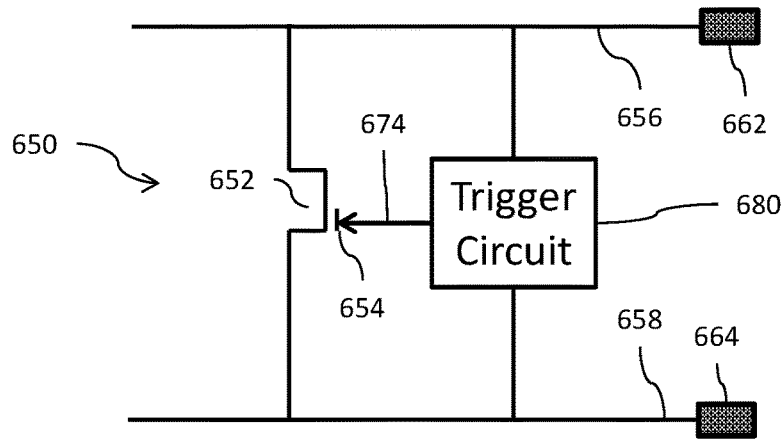
FIG. 21 shows a circuit diagram for an ESD supply clamp device using an impact ionization MOSFET (IMOS) device.

Reference is now made to FIG. 21 showing a circuit diagram for an ESD supply clamp device 650 using a GGIMOS device. The device 650 is formed by a GGIMOS device 652 coupled between a first supply line 656 of an integrated circuit and a second supply line 658 of the integrated circuit. The GGIMOS device 652 has a drain terminal coupled to the first supply line 656 and a source terminal coupled to the second supply line 658. In this implementation, the first supply line 656 may be coupled to a positive power supply pad 662 for the integrated circuit and the second supply line 658 may be coupled to a negative or ground power supply pad 664 for the integrated circuit. A partially covering gate terminal 654 of the GGIMOS device 602 receives a trigger signal 674. The trigger signal 674 is generated by a trigger circuit 680 that senses a transient voltage difference on the first or second supply lines 656 and 658, respectively, and asserts the trigger signal 674 to turn on the GGIMOS device 652 in response to the sensed difference. In comparison to the prior art implementation of FIG. 2, the ESD supply clamp device 650 advantageously replaces both the return diode 32 and the switch 34. Alternatively, the switch (transistor 634) may be included and driven by the same trigger signal as the GGIMOS device 652 (compare to FIG. 20B).

The GGIMOS device 652 may be implemented as shown in FIG. 17A (described above).

Figure 22:
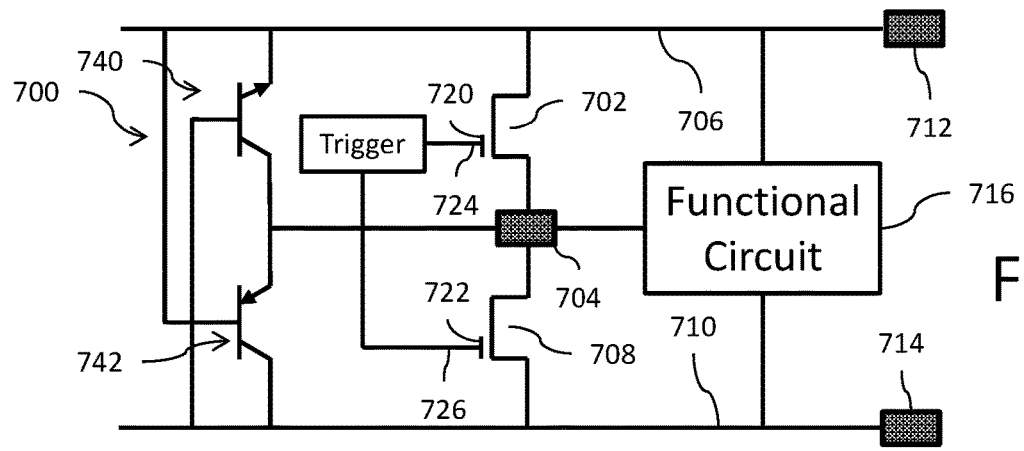
FIG. 22 shows a circuit diagram for an ESD protection device using IMOS devices with parasitic bipolar transistors in parallel.

Reference is now made to FIG. 22 which shows a circuit diagram for an ESD protection device 700 using impact ionization MOSFET (IMOS) devices. The device 700 is formed by a first IMOS device 702 coupled between an input/output pad 704 and a first supply line 706 of an integrated circuit, and a second IMOS device 708 coupled between the input/output pad 704 and a second supply line 710 of the integrated circuit. The first IMOS device 702 has a drain terminal coupled to the input/output pad 704 and a source terminal coupled to the first supply line 706. The second IMOS device 708 has a source terminal coupled to the input/output pad 704 and a drain terminal coupled to the second supply line 710. In this implementation, the first supply line 706 may be coupled to a positive power supply pad 712 for the integrated circuit and the second supply line 710 may be coupled to a negative or ground power supply pad 714 for the integrated circuit. The input/output pad 704 is coupled to functional circuitry 716, supplied from the first and second supply lines, of the integrated circuit. A gate terminal 720 of the first IMOS device 702 receives a first trigger signal 724 and a gate terminal 722 of the second IMOS device 708 receives a second trigger signal 726. The first and second trigger signals 724 and 726 are generated by a trigger circuit (see for example, circuits 130 and 630 as described herein) that senses a transient voltage difference on the first or second supply lines 706 and 710, respectively, or on the input/output pad 704 and asserts the first and second trigger signals 724 and 726 to turn on one or more of the first and second IMOS devices, 702 and 708, respectively, in response to the sensed difference.

The first and second IMOS devices 702 and 708, respectively, are implemented in a manner such that each IMOS device includes a parallel connected parasitic bipolar transistor. For example, the first IMOS device 702 includes a parasitic NPN bipolar transistor 740 having an emitter coupled to the first supply line 706 and a collector coupled to the input/output pad 704. A base of the parasitic NPN bipolar transistor 740 is coupled to the second supply line 710. The second IMOS device 708 includes a parasitic PNP bipolar transistor 742 having an emitter coupled to the input/output pad 704 and a collector coupled to the second supply line 710. A base of the parasitic PNP bipolar transistor 742 is coupled to the first supply line 706.

The circuit of FIG. 22 may further include a transistor 134 (see FIG. 5) connected between the first and second supply lines and have a gate coupled to receive the trigger signal from the trigger circuit. In an embodiment, as shown for reference in FIG. 5, the same trigger signal may be applied to the IMOS devices and the transistor 134, or separate trigger signals could instead be generated by the trigger circuit.

Figure 23A:
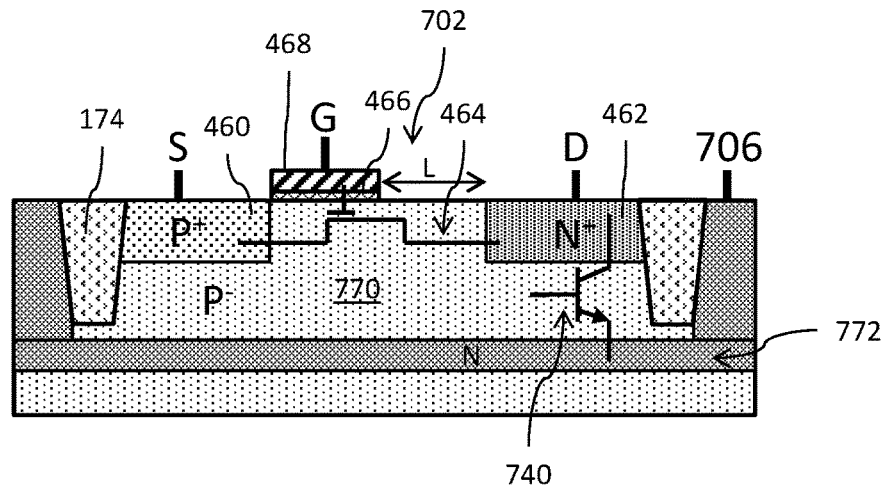
FIGS. 23A-23B show cross-sectional diagram of integrated TFET devices for use in the device of FIG. 22.

Reference is now made to FIG. 23A showing a cross-sectional diagram of an integrated IMOS device with a parasitic vertical NPN bipolar transistor. Like reference numbers refer to like or similar parts in FIG. 17A, but the implementation in FIG. 23A is provided with a bulk substrate. This integrated IMOS device can be used to provide the first IMOS device 702 with parasitic NPN bipolar transistor 740 as shown in FIG. 22. Here, the body 770 provides the base of the parasitic NPN bipolar transistor 740, with the deep N-well 772 providing the emitter of the parasitic NPN bipolar transistor 740. The drain 462 region provides the collector.

Figure 23B:
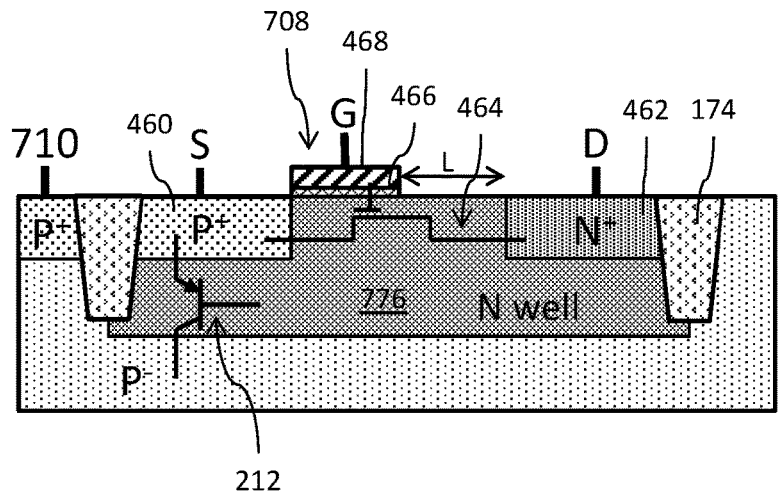

Reference is now made to FIG. 23B showing a cross-sectional diagram of an integrated IMOS device with a parasitic vertical PNP bipolar transistor. Like reference numbers refer to like or similar parts in FIG. 17A, but the implementation in FIG. 23B is provided with a bulk substrate. This integrated IMOS device can be used to provide the second TFET device 708 with parasitic PNP bipolar transistor 742 as shown in FIG. 22. Here, the body of the second IMOS device 708 and base of the parasitic PNP bipolar transistor 742 is provided by an N-well 776 formed within the p-type substrate. The source region 460 provides the emitter.

In both FIG. 23A and FIG. 23B, the IMOS is implemented as a partially covered gated diode device biased in the reverse bias mode. In this IMOS configuration, the gate 468 only partially covers the channel 464 region and is specifically positioned adjacent to the source 460 region and is offset from the drain 462 region by a distance L that is, for example, less than or equal to one-half of the overall gate length and more than or equal to one-quarter of the overall gate length. This positioning differs from conventional IMOS designs (FIG. 17B) which position the partially covering gate structure adjacent to the drain region.

Operation of the device 700 may be better understood by reference to an example. If a negative ESD event occurs at the input/output pad 704, the diode of the second IMOS device 708 becomes forward biased and the first IMOS device 102 operates in transistor mode actuated in response to the trigger signal to provide an additional path for ESD discharge through the first supply line 706. In addition, the parasitic NPN bipolar transistor 710 is turned on providing an additional discharge path to the first supply line 706.

Figure 24A:
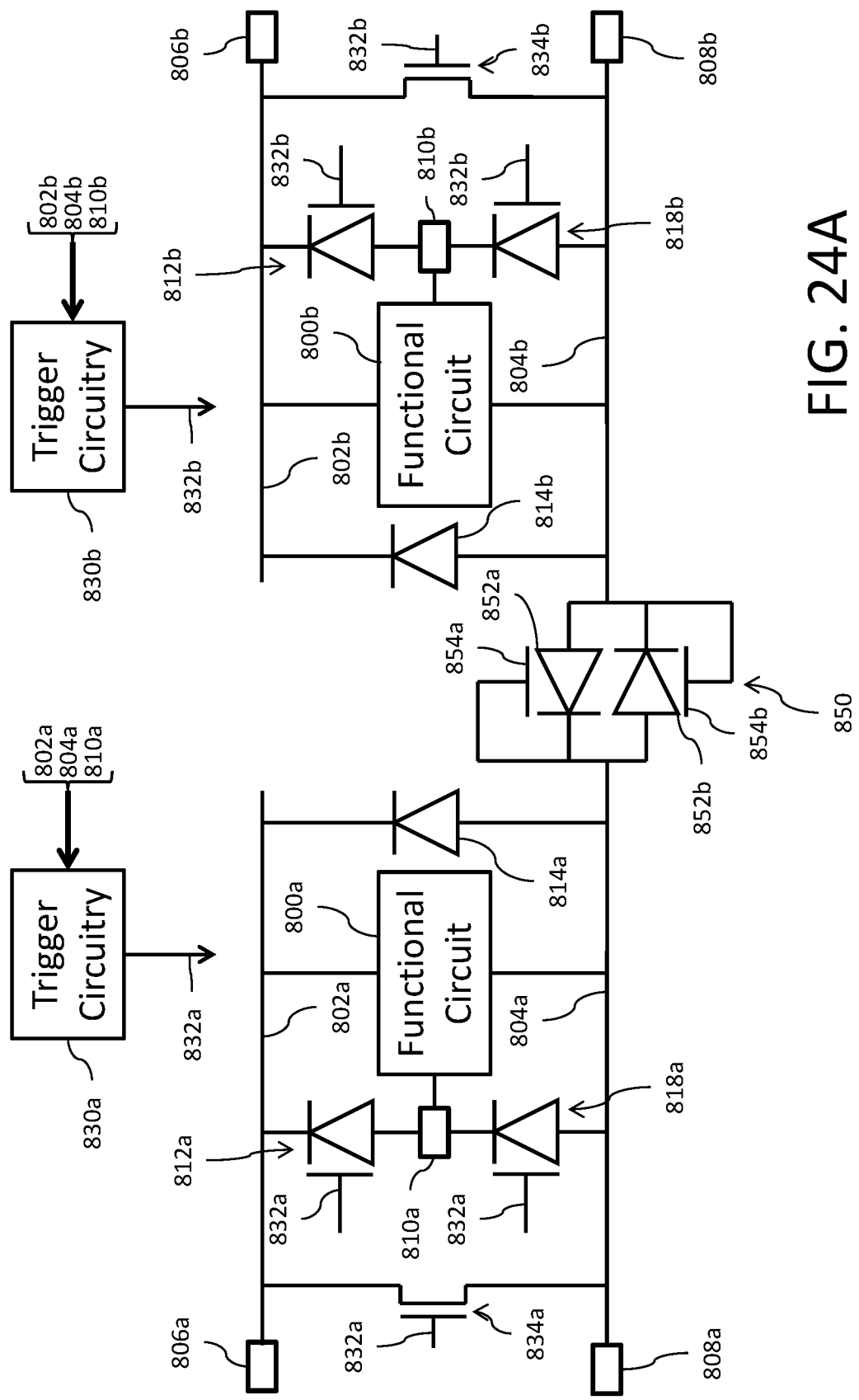
FIGS. 24A-24B show configurations for ESD protection with multiple power supply domains.

An integrated circuit may include multiple power supply domains for functional circuits supported on a common substrate. FIG. 24A shows a configuration with a first power supply domain for first functional circuits 800*a* including a first power supply line 802*a* and a second power supply line 804*a*, and a second power supply domain for second functional circuits 800*b* including a first power supply line 802*b* and a second power supply line 804*b*. In this implementation, the first supply line 802*a* of the first power supply domain may be coupled to a positive power supply pad 806*a* for the integrated circuit and the second supply line 804*a* for the first power supply domain may be coupled to a negative or ground power supply pad 808*a* for the integrated circuit. Likewise, the first supply line 802*b* of the second power supply domain may be coupled to a positive power supply pad 806*b* for the integrated circuit and the second supply line 804*b* for the second power supply domain may be coupled to a negative or ground power supply pad 808*b* for the integrated circuit.

ESD protection circuitry is provided for each power supply domain. For example, corresponding to FIG. 5, TFET devices 812*a* and 818*a* may be provided with respect to an input/output pad 810*a* for the first power supply domain, and TFET devices 812*b* and 818*b* may be provided with respect to an input/output pad 810*b* for the second power supply domain. Trigger circuitry 830*a* and 830*b* is provided with respect to each power supply domain to monitor voltages at the corresponding supply lines and input/output pads in order to detect ESD events and generate trigger signals 832*a* and 832*b* for actuating the TFET devices.

Additionally, a power supply clamp device 814*a* may be provided between supply lines 802*a* and 804*a* for the first power supply domain and a power supply clamp device 814*b* may be provided between supply lines 802*b* and 804*b* for the second power supply domain. Although a protection diode for the clamps 814 is shown, it will be understood that this is by way of example only and that any suitable supply clamp circuit could be used.

Furthermore, a transistor switching circuit 834*a* and 834*b* is coupled between the first and second supply lines 802*a*/ 802*b* and 804*a*/804*b*, respectively. The gate terminal of each transistor switching circuit 834*a*/834*b* is coupled to receive the trigger signal 832 generated by the trigger circuit 830. In an embodiment, the trigger signal 832 may be the same signal for all triggered devices. Alternatively, different trigger signals may be generated.

The integrated circuit further includes a cutter circuit 850 coupled between the second supply line 804*a* for the first power supply domain and the second supply line 804*b* for the second power supply domain. The cutter circuit 850 is formed by a pair of TFET devices 852*a* and 852*b* coupled in a back to back (i.e., anti-parallel) configuration. The first TFET device 852*a* includes a source terminal coupled to the second supply line 804*a* for the first power supply domain and a drain terminal coupled to the second supply line 804b for the second power supply domain. The second TFET device 852b includes a source terminal coupled to the second supply line 804b for the second power supply domain and a drain terminal coupled to the second supply line 804a for the first power supply domain. The gate terminal 854a of the TFET device 852a is coupled to the second supply line 804a for the first power supply domain, while the gate terminal 854b of the TFET device 852b is coupled to second supply line 804b for the second power supply domain. The cutter circuit 850 configuration advantageously utilizes the ambipolar transport properties of the TFET devices 852a and 852b.

The implementation of circuits shown in FIG. 24A is equally applicable any configuration of the supply nodes. For example, the circuit of FIG. 24A may be used in connection with: a multiple VDD and multiple ground configuration, a single VDD and multiple ground configuration, a multiple VDD and single ground configuration, and a single VDD and single ground configuration.

Figure 24B:
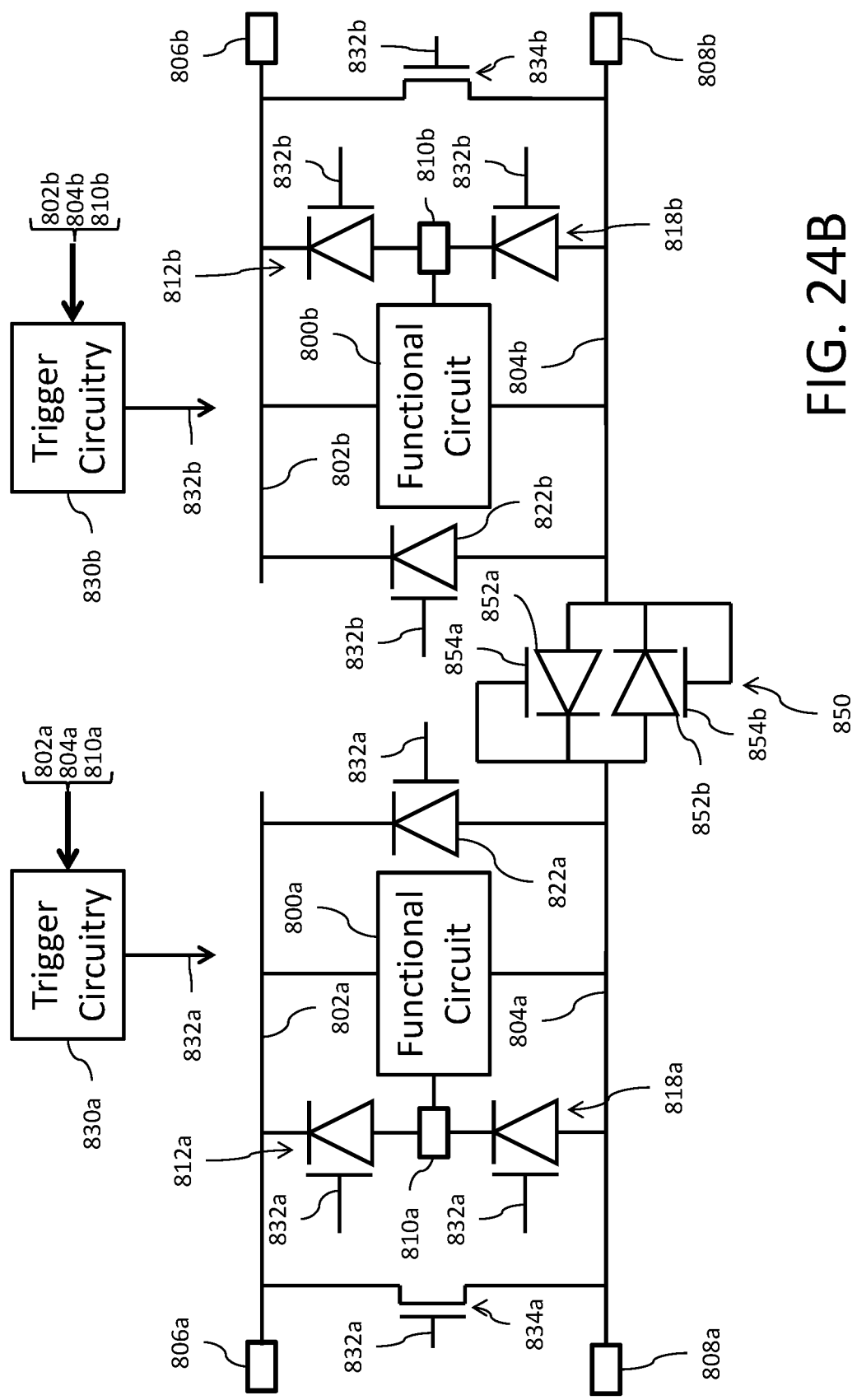

In an alternative implementation shown in FIG. 24B, the diodes 812a and 812b are replaced with TFET devices 822a and 822b, respectively. The TFET device 822a is triggered by the signal 832a and the TFET device 822b is triggered by the signal 832b.

Figure 25:
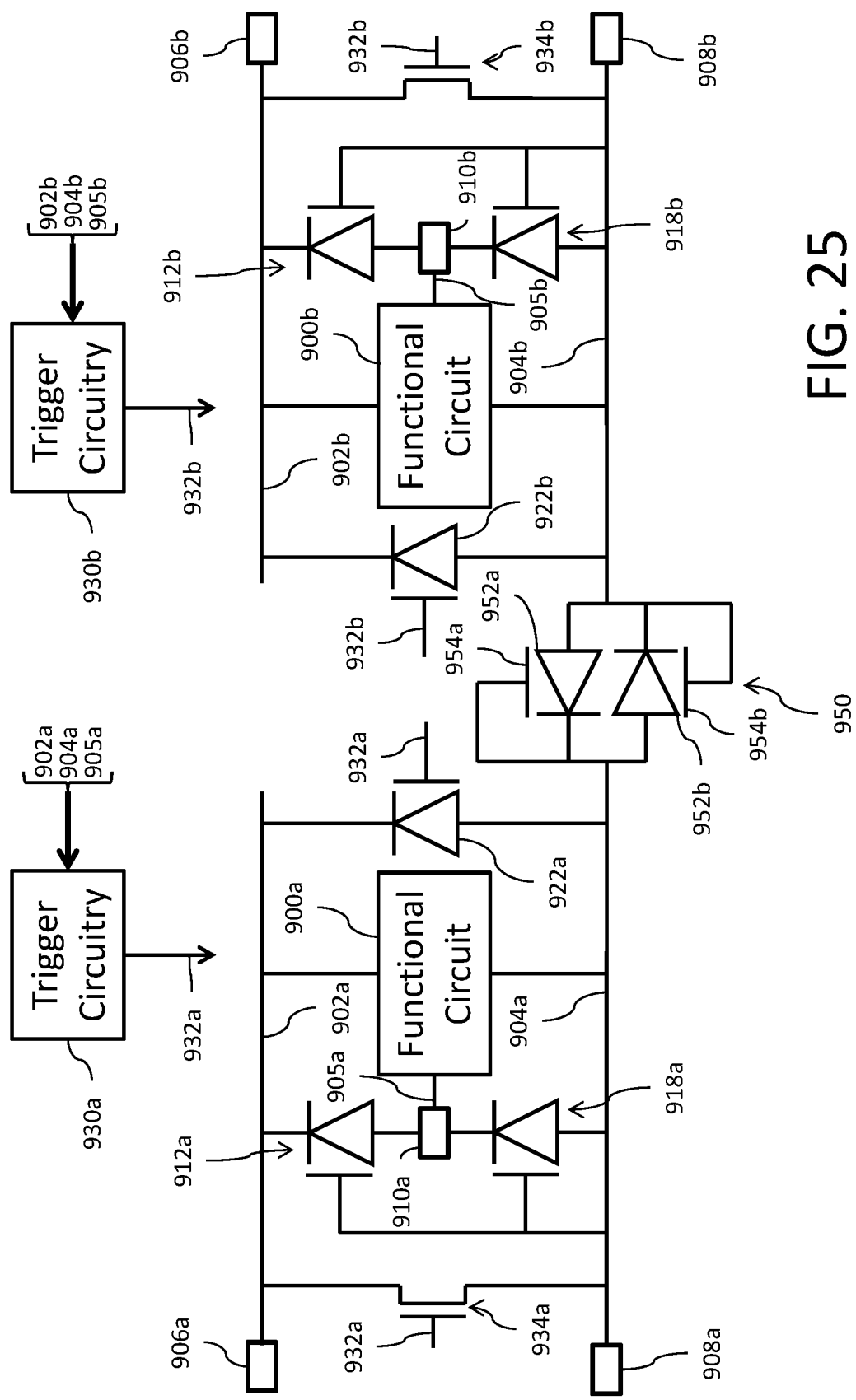
FIG. 25 shows a circuit diagram for an ESD protection device using TFET devices.

Reference is now made to FIG. 25 showing a configuration with a first power supply domain for first functional circuits 900a including a first power supply line 902a, a second power supply line 904a and a ground power supply line 905a, and a second power supply domain for second functional circuits 900b including a first power supply line 902b, a second power supply line 904b and a ground power supply line 905b. In this implementation, the first supply line 902a of the first power supply domain may be coupled to a positive power supply pad 906a for the integrated circuit, the second supply line 904a for the first power supply domain may be coupled to a negative power supply pad 908a for the integrated circuit, and the ground power supply line 905a may be coupled to a ground power supply pad 910a. Likewise, the first supply line 902b of the second power supply domain may be coupled to a positive power supply pad 906b for the integrated circuit, the second supply line 904b for the second power supply domain may be coupled to a ground power supply pad 908b for the integrated circuit, and the ground power supply line 905b may be coupled to a ground power supply pad 910b.

ESD protection circuitry is provided for each power supply domain. For example, corresponding to FIG. 5, TFET devices 912a and 918a may be provided with respect to the pad 910a for the first power supply domain, and TFET devices 912b and 918b may be provided with respect to the pad 910b for the second power supply domain. The control gates of the TFET devices 912a and 918a are coupled to the second power supply line 904a, and the control gates of the TFET devices 912b and 918b are coupled to the second power supply line 904b.

A TFET device 922a is coupled between the first power supply line 902a and the second power supply line 904a. Trigger circuitry 930a and 930b is provided with respect to each power supply domain to monitor voltages at the corresponding supply lines and input/output pads in order to detect ESD events and generate trigger signals 932a and 932b for actuating the TFET devices 922a and 922b.

Furthermore, a transistor switching circuit 934a and 934b is coupled between the first and second supply lines 902a/902b and 904a/904b, respectively. The gate terminal of each transistor switching circuit 934a/934b is coupled to receive the trigger signal 932 generated by the trigger circuit 930. In an embodiment, the trigger signal 932 may be the same signal for all triggered devices. Alternatively, different trigger signals may be generated.

The integrated circuit further includes a cutter circuit 950 coupled between the second supply line 904a for the first power supply domain and the second supply line 904b for the second power supply domain. The cutter circuit 950 is formed by a pair of TFET devices 952a and 952b coupled in a back to back (i.e., anti-parallel) configuration. The first TFET device 952a includes a source terminal coupled to the second supply line 904a for the first power supply domain and a drain terminal coupled to the second supply line 904b for the second power supply domain. The second TFET device 952b includes a source terminal coupled to the second supply line 904b for the second power supply domain and a drain terminal coupled to the second supply line 904a for the first power supply domain. The gate terminal 954a of the TFET device 952a is coupled to the second supply line 904a for the first power supply domain, while the gate terminal 954b of the TFET device 952b is coupled to second supply line 904b for the second power supply domain. The cutter circuit 950 configuration advantageously utilizes the ambipolar transport properties of the TFET devices 952a and 952b.

The implementation of circuits shown in FIG. 25 is equally applicable any configuration of the supply nodes. For example, the circuit of FIG. 25 may be used in connection with: a multiple VDD and multiple ground configuration, a single VDD and multiple ground configuration, a multiple VDD and single ground configuration, and a single VDD and single ground configuration.

Because the TFETs 912a, 918a, 912b and 918b have their control terminals coupled to the second supply line 904a and 904b instead of to a trigger circuit, the tunneling effect will occur at a higher potential in comparison to a trigger circuit actuated TFET as discussed in connection with other embodiments. However, an advantage of the circuit 900 is that it occupies a reduced area and can be fabricated at a lower cost.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A circuit, comprising:
a first power supply line;
an input/output node;
a protection circuit having a first terminal electrically coupled to the input/output node and a second terminal electrically coupled to the first power supply line;
a silicon controlled rectifier (SCR) device having an anode terminal electrically coupled to the input/output node and a cathode terminal electrically coupled to the first power supply line, the SCR device having a first internal node; and
a first gate grounded impact ionization MOSFET (GGI-MOS) device having a drain terminal electrically coupled to the internal node, a source terminal electrically coupled to the first power supply line and a gate terminal electrically coupled to the first power supply line.

2. The circuit of claim 1, wherein the protection circuit comprises a diode having a cathode electrically coupled to the input/output node and an anode electrically coupled to the first power supply line.

3. The circuit of claim 1, wherein the protection circuit comprises a second GGIMOS device having a drain terminal electrically coupled to the input/output node, a source terminal electrically coupled to the first power supply line and a gate terminal electrically coupled to the first power supply line.

4. The circuit of claim 1, further including:
a second power supply line; and
a functional circuit electrically coupled to the input/output node and electrically coupled for power supply to the first and second power supply lines.

5. The circuit of claim 1, wherein the first GGIMOS device comprises a source region of a first conductivity type, a drain region of a second conductivity type opposite the first conductivity type and a channel region with an insulated gate positioned over the channel region adjacent to the source region and offset from the drain region.

6. The circuit of claim 5, wherein the channel region has a length, and wherein the insulated gate has a length less than the length of the channel region.

7. The circuit of claim 6, wherein the offset is between about one-quarter of the length of the channel region and one-half of the length of the channel region.

8. The circuit of claim 1, wherein the SCR device comprises:
a PNP bipolar transistor having an emitter electrically coupled to the input/output node, a gate electrically coupled to the first internal node and a collector electrically coupled to a second internal node; and
an NPN bipolar transistor having an emitter electrically coupled to the first power supply line, a gate electrically coupled to the second internal node and a collector electrically coupled to the first internal node.

9. The circuit of claim 8, wherein the SCR device further comprises:
a first resistor electrically coupled between the input/output node and the first internal node; and
a second resistor electrically coupled between the second internal node and the first power supply line.

10. A circuit, comprising:
a first power supply line;
an input/output node;
a protection device having a first terminal electrically coupled to the input/output node and a second terminal electrically coupled to the first power supply line;
a silicon controlled rectifier (SCR) device having an anode terminal electrically coupled to the input/output node and a cathode terminal electrically coupled to the first power supply line, the SCR device having a first internal node and a second internal node; and
a first gate grounded impact ionization MOSFET (GGIMOS) device having a drain terminal electrically coupled to the first internal node, a source terminal electrically coupled to the second internal node and a gate terminal electrically coupled to one of the first and second internal nodes.

11. The circuit of claim 10, wherein the protection device is a diode having a cathode electrically coupled to the input/output node and an anode electrically coupled to the first power supply line.

12. The circuit of claim 10, wherein the protection device comprises a second GGIMOS device having a drain terminal electrically coupled to the input/output node, a source terminal electrically coupled to the first power supply line and a gate terminal electrically coupled to the first power supply line.

13. The circuit of claim 10, further including:
a second power supply line; and
a functional circuit electrically coupled to the input/output node and electrically coupled for power supply to the first and second power supply lines.

14. The circuit of claim 10, wherein the first GGIMOS device comprises a source region of a first conductivity type, a drain region of a second conductivity type opposite the first conductivity type and a channel region with an insulated gate positioned over the channel region adjacent to the source region and offset from the drain region.

15. The circuit of claim 14, wherein the channel region has a length, and wherein the insulated gate has a length less than the length of the channel region.

16. The circuit of claim 15, wherein the offset is between about one-quarter of the length of the channel region and one-half of the length of the channel region.

17. The circuit of claim 10, wherein the SCR device comprises:
a PNP bipolar transistor having an emitter electrically coupled to the input/output node, a gate electrically coupled to the first internal node and a collector electrically coupled to the second internal node; and
an NPN bipolar transistor having an emitter electrically coupled to the first power supply line, a gate electrically coupled to the second internal node and a collector electrically coupled to the first internal node.

18. The circuit of claim 17, wherein the SCR device further comprises:
a first resistor electrically coupled between the input/output node and the first internal node; and
a second resistor electrically coupled between the second internal node and the first power supply line.

* * * * *